United States Patent [19]
Fujii et al.

[11] Patent Number: 5,905,284
[45] Date of Patent: May 18, 1999

[54] SEMICONDUCTOR DEVICE WITH A PARTICULAR DMISFET STRUCTURE

[75] Inventors: Taizo Fujii; Takehiro Hirai; Sugao Fujinaga, all of Osaka, Japan

[73] Assignee: Matsushita Electric Industrial Co., LTD., Osaka, Japan

[21] Appl. No.: 08/859,366

[22] Filed: May 20, 1997

Related U.S. Application Data

[62] Division of application No. 08/701,913, Aug. 23, 1996, Pat. No. 5,817,551.

[30] Foreign Application Priority Data

Aug. 25, 1995 [JP] Japan ................................... 7-217227
Sep. 8, 1995 [JP] Japan ................................... 7-231189

[51] Int. Cl.$^6$ .............................. H01L 29/76; H01L 29/94
[52] U.S. Cl. ........................... 257/335; 257/336; 257/338; 257/378
[58] Field of Search ................................... 257/335, 336, 257/338, 341, 342, 343, 369, 370

[56] References Cited

U.S. PATENT DOCUMENTS

| 4,007,478 | 2/1977 | Yagi ........................................... 357/41 |
| 4,232,439 | 11/1980 | Shibata .................................... 438/197 |
| 4,969,020 | 11/1990 | Matsushita et al. ..................... 257/338 |
| 5,254,866 | 10/1993 | Ogoh ........................................ 257/369 |
| 5,382,536 | 1/1995 | Malhi et al. ............................. 438/197 |
| 5,386,136 | 1/1995 | Williams et al. ........................ 257/339 |
| 5,441,906 | 8/1995 | Burger ..................................... 438/199 |

FOREIGN PATENT DOCUMENTS

| 0 005 720 | 12/1979 | European Pat. Off. . |
| 0 731 504 | 9/1995 | European Pat. Off. . |
| 61 203679 | 9/1986 | Japan . |
| 63 202971 | 2/1987 | Japan . |
| 1-238062 | 9/1989 | Japan ..................................... 257/343 |
| 2 291173 | 11/1990 | Japan . |
| 2 046 993 | 11/1980 | United Kingdom . |
| 2 277 406 | 10/1994 | United Kingdom . |

OTHER PUBLICATIONS

Zahir Parpia et al., "A CMOS–Compatible High–Voltage IC Process", IEEE Transactions on Electron Devices, Oct. 88, vol. 35, Nr. 10, pp. 1687–1694.

Fujishima et al., High–Performance Lateral DMOSFET with Oxide Sidewall Spacers; Proceedings of the International Symposium on Power Semiconductor Devices, pp. 349–352 (May 1994).

Su et al., A High–Performance Scalable Submicron MOSFET for Mixed Analog/Digital Applicatons; Proceedings of the International Electron Devices Meeting, pp. 91/367–370 (Dec. 1991).

Primary Examiner—Wael Fahmy
Attorney, Agent, or Firm—McDermott, Will & Emery

[57] ABSTRACT

In forming a P$^-$ body diffused layer in a portion on the source side of an N$^-$ drain diffused layer of a DMOSFET, P-type impurity ions are implanted at a large tilt angle to reach a part of a region underlying an N$^+$ gate electrode by using, as a mask, a resist film having an opening corresponding to a region in which the body diffused layer of the DMOSFET is to be formed and the N$^+$ gate electrode so as to be activated. Thereafter, an N$^+$ source diffused layer and an N$^+$ drain diffused layer are formed in the P$^-$ body diffused layer and in the N$^-$ drain diffused layer, respectively. Since a high-temperature drive-in process need not be performed to introduce the P-type impurity ions into the region underlying the N$^+$ gate electrode, a reduction or variations in threshold voltage and the degradation of a gate oxide film each caused by the impurity diffused from the N$^+$ gate electrode can be prevented. Consequently, there is provided a semiconductor device having a DMOSFET mounted thereon which has a reduced on-resistance and suppresses the activation of a parasitic bipolar transistor due to reduced variations in threshold voltage and a high-quality gate oxide film.

13 Claims, 22 Drawing Sheets

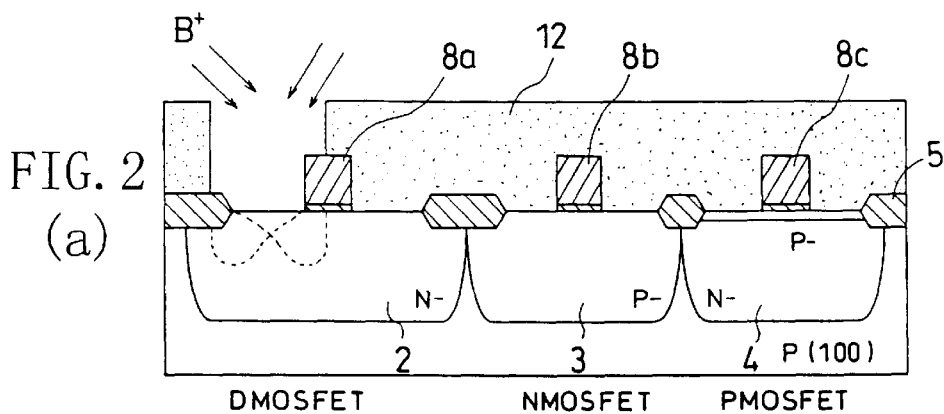
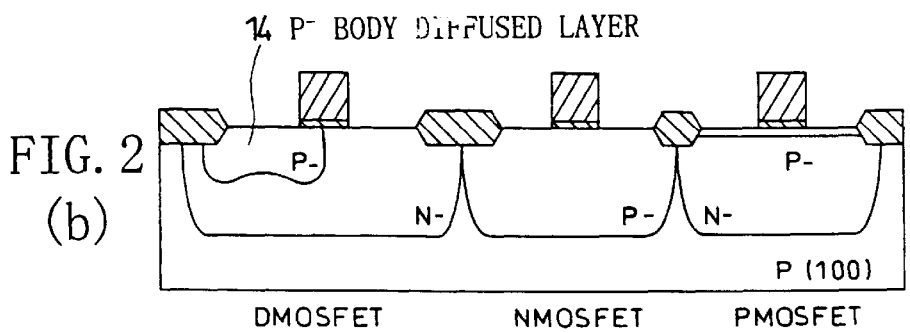
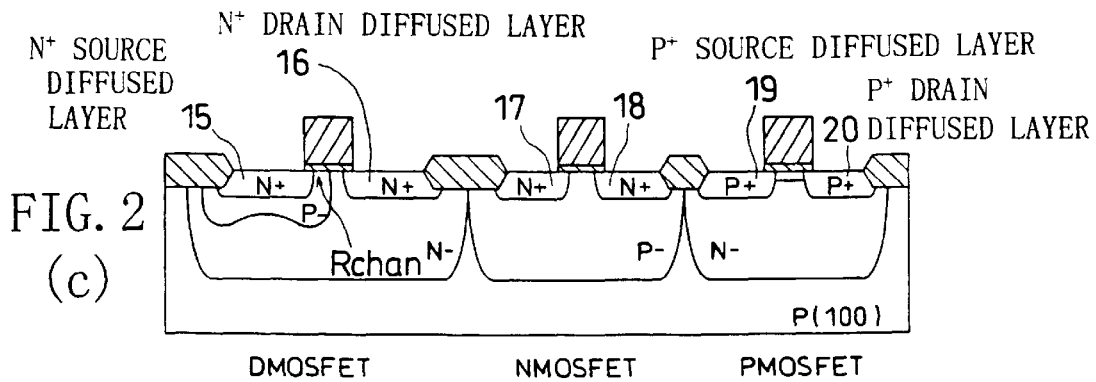

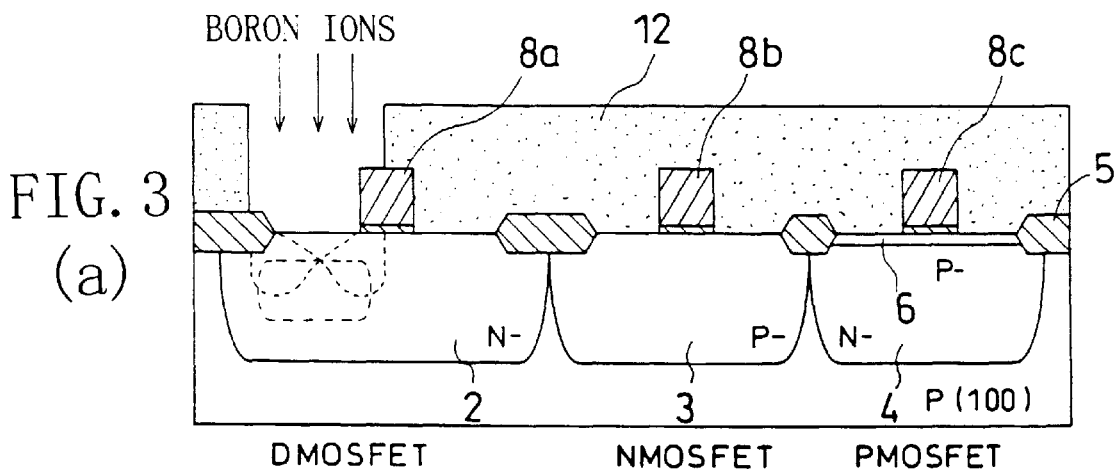
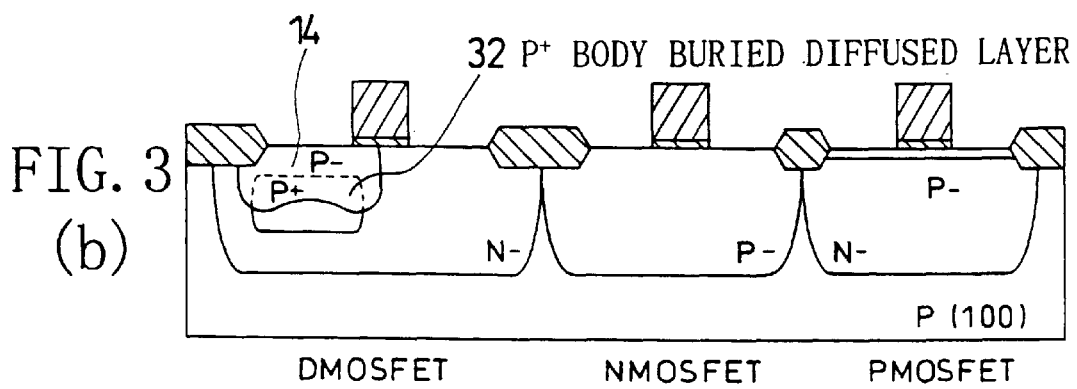
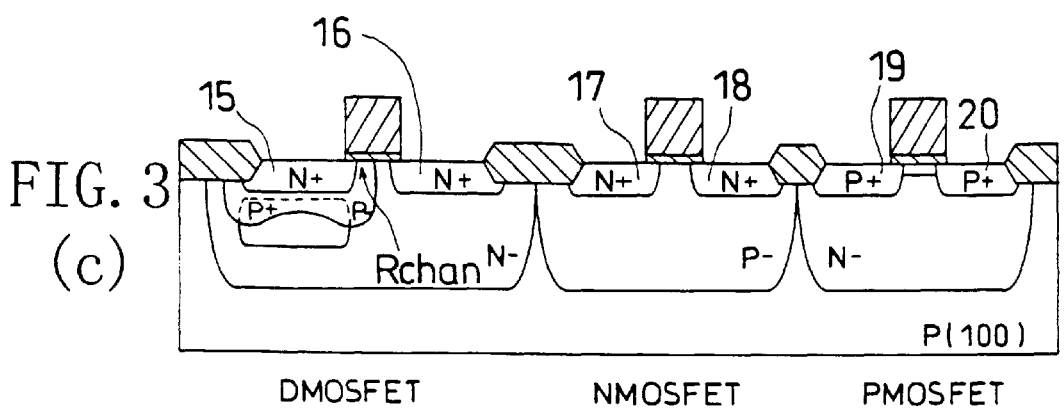

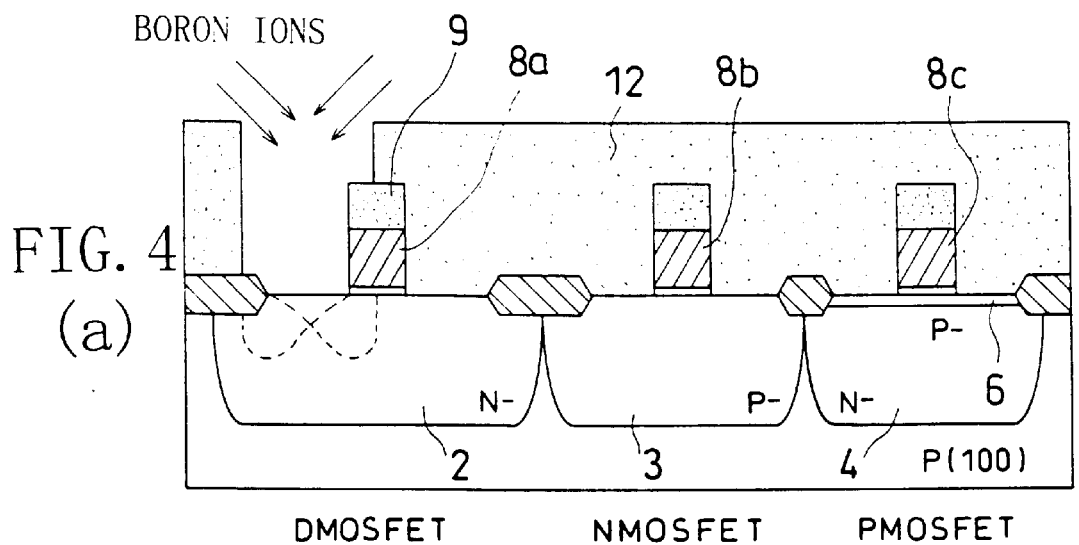
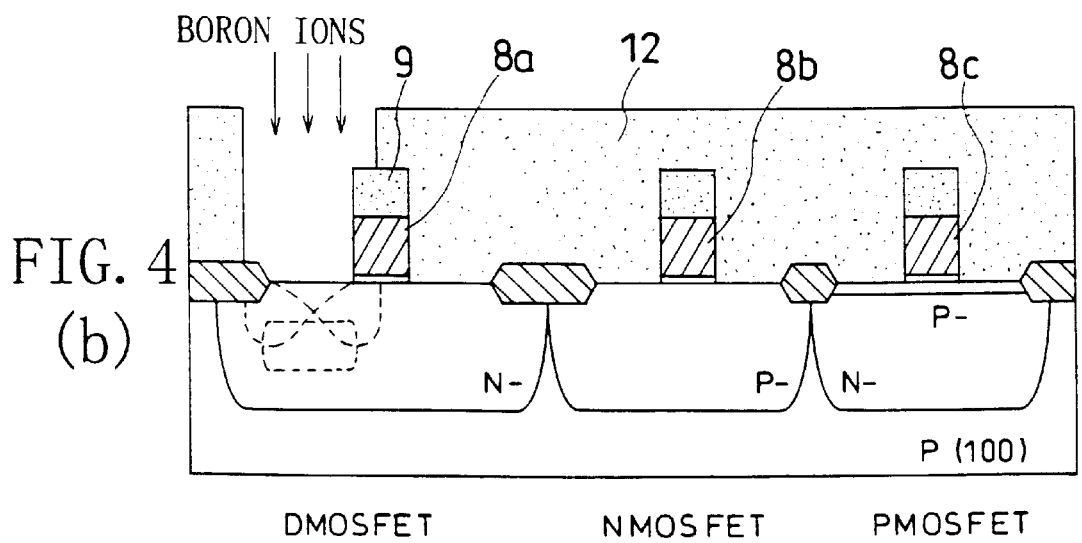

DMOSFET   NMOSFET   PMOSFET

DMOSFET   NMOSFET   PMOSFET

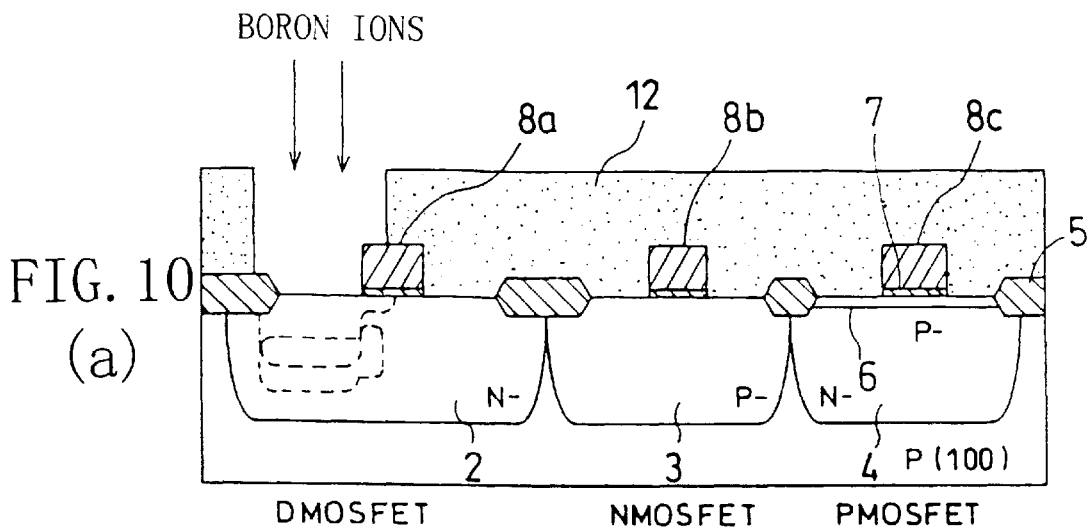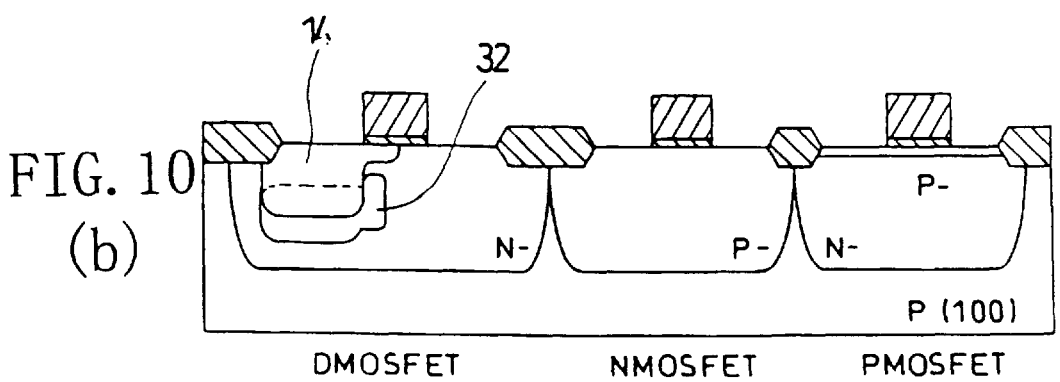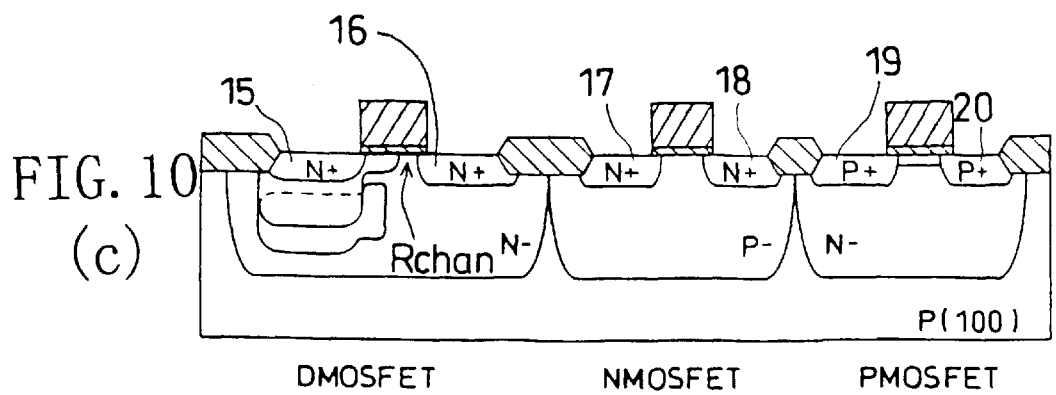

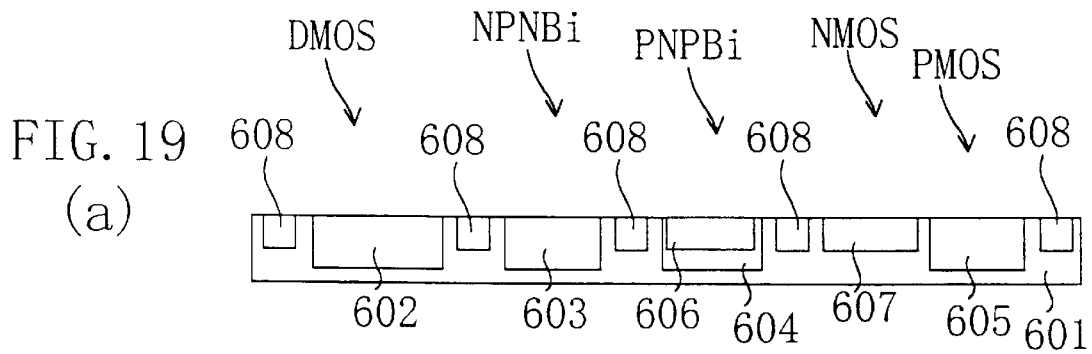
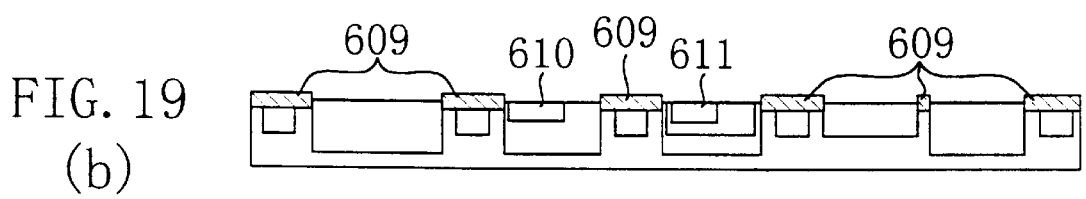
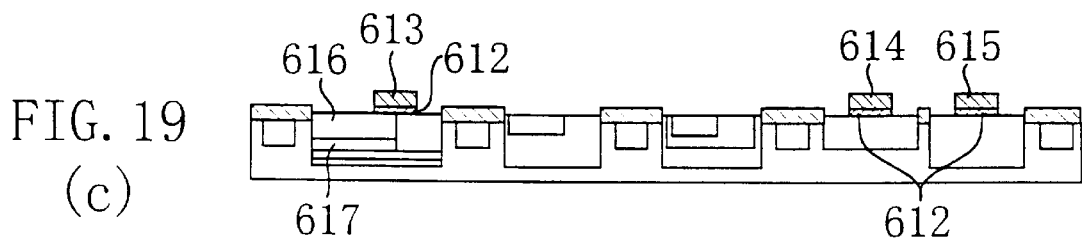
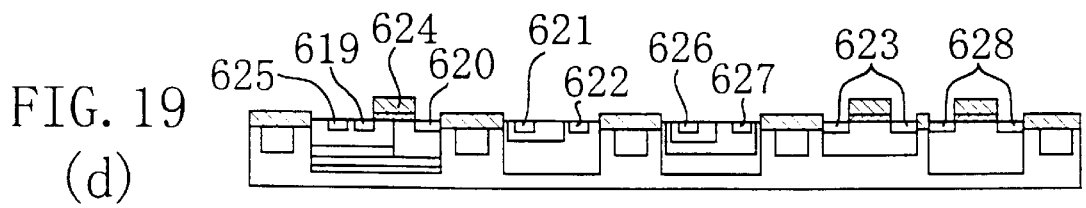
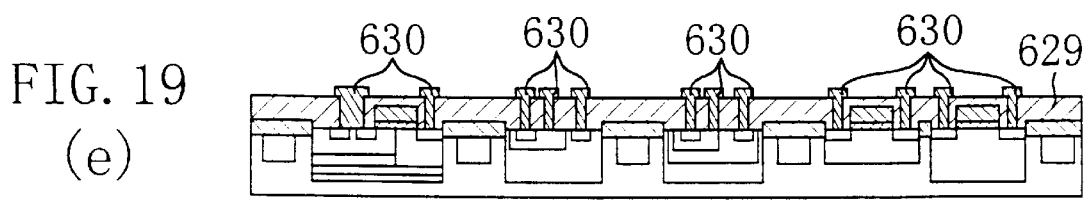

DMOSFET  NMOSFET  PMOSFET

DMOSFET  NMOSFET  PMOSFET

SEMICONDUCTOR DEVICE WITH A PARTICULAR DMISFET STRUCTURE

This is a divisional of application Ser. No. 08/701,913, filed Aug. 23, 1996, now Pat. No. 5,817,551.

BACKGROUND OF THE INVENTION

The present invention relates to a semiconductor device having a MOSFET for high voltage, such as a DMOSFET (Double Diffused MOSFET), mounted thereon or to an LSI having a bipolar transistor or CMOSFET in addition to the DMOSFET or the like and to a method of manufacturing the same.

In recent years, there have been an increasing number of proposals for integrating a semiconductor device of DMOS transistor (Double Diffused MOS Transistor) structure with a device of different type.

By way of example, a description will be given to a device obtained by integrating a semiconductor device of DMOS structure with a CMOS device with reference to FIGS. 20(a) and 20(b) and FIGS. 21(a) and 21(b). First, as shown in FIG. 20(a), an N⁻ drain diffused layer 1002, a P⁻-well diffused layer 1003, and an N⁻-well diffused layer 1004 are sequentially formed on a P-type semiconductor substrate 1000 having a (100) plane as the main surface, followed by the formation of an isolation 1005 in the surface of the semiconductor substrate 1000 by selective oxidation process for defining a region in which a DMOSFET is to be formed, a region in which an NMOSFET is to be formed, and a region in which a PMOSFET is to be formed.

Next, as shown in FIG. 20(b), gate oxide films 1007 are formed and a polysilicon film 1008 is deposited thereon by low-pressure CVD. After an N⁺ gate electrode 1008a of the DMOSFET, an N⁺ gate electrode 1008b of the NMOSFET, and an N⁺ gate electrode 1008c of the PMOSFET are formed by using a resist film for forming gate electrodes (not shown), the resist film is removed. Subsequently, a new resist film 1009 is formed so that boron ions are selectively implanted into a region in which a source is to be formed (a region defined by the dashed curve and the line representing the surface of the P-type semiconductor substrate 1000) in an N⁻ drain diffused layer 1002 of the DMOSFET by using the resist film 1009 and the N⁺ gate electrode 1008a of the DMOSFET as a mask, followed by a high-temperature drive-in process, thereby forming a P⁻ body diffused layer 1014 shown in FIG. 21(a).

Then, as shown in FIG. 21(a), B⁺ ions are selectively implanted into only the region in which the PMOSFET is to be formed by using the resist film 1012 as a mask to control the threshold of the PMOSFET, thereby forming a P⁻ diffused layer 1013 for Vt control.

Thereafter, as shown in FIG. 21(b), an N⁺ source diffused layer 1015 and an N⁺ drain diffused layer 1016 of the DMOSFET, an N⁺ source diffused layer 1017 and an N⁺ drain diffused layer 1018 of the NMOSFET, and a P⁺ source diffused layer 1019 and a P⁺ drain diffused layer 1020 of the PMOSFET are formed, followed by the formation of metal interconnections for the respective elements, thereby finishing the device.

In this manner, a composite LSI of a DMOS transistor and a CMOS transistor is manufactured.

However, a semiconductor device and a method of manufacturing the same as shown in FIGS. 20(a) and 20(b) and FIGS. 21(a) and 21(b) have the following problems.

(1) In the PMOSFET, the depth of the P⁻ diffused layer 1013 for Vt control varies considerably since it is formed by forming the N⁺ gate electrode 1008c and then implanting B ions for Vt control through the gate electrode 1008c. If the depth of the P⁻ diffused layer 1013 for Vt control varies in a PMOSFET having such a buried channel structure, the threshold Vt thereof varies greatly. Accordingly, variations in the threshold Vt of the PMOSFET are highly dependent on the film quality and thickness of the gate electrode 1008c which may influence the projected range (Rp) of the implanted B ions. When polysilicon is used as a material composing the gate electrode, in particular, a film of uniform quality cannot be formed because of grain size extremely difficult to control, which causes significant variations in the projected range (Rp) of the implanted B ions and in the threshold Vt of the PMOSFET.

(2) As the gate oxide films 1007 become thinner with the increasing miniaturization of the device, the impurity in the gate electrodes is diffused into the channel regions through the gate oxide films 1007 by the high-temperature drive-in process performed after the formation of the respective gate electrodes 1008a, 1008b, and 1008c in the DMOSFET, NMOSFET, and PMOSFET to form the P⁻ body diffused layer 1014 of the DMOSFET, which not only causes variations in threshold Vt but also reduces the reliability of the gate oxide films, since the impurity is diffused through the gate oxide films 1007.

To avoid the problems, the individual gate insulating films and gate electrodes of the DMOSFET and CMOSFET have been formed discretely in the conventional manufacturing process, which requires two steps of depositing a polysilicon film and two steps of patterning the polysilicon film, resulting in increased manufacturing cost and reduced production yield.

On the other hand, Japanese Laid-Open Patent Publication HEI 3-205832 discloses another method of manufacturing a semiconductor device having a DMOSFET on a semiconductor substrate.

First, as shown in FIG. 22(a), an insulated gate 1102 made of polysilicon or like material is formed on a surface of an N-type semiconductor substrate 1101 in which a drain is to be formed. Then, as shown in FIG. 22(b), a P-type body diffused layer 1103 is formed by using the insulated gate 1102 as a part of a mask. Subsequently, as shown in FIG. 22(c), a source diffused layer 1104 and a drain contact diffused layer 1105 are formed by using the insulated gate 1102 as a part of a mask. At this stage, a portion underlying the insulated gate 1102 and corresponding to a difference in lateral diffusion length between the body diffused layer 1103 and the source diffused layer 1104 forms a channel region 1106, thereby completing the formation of all the diffused layers. Thereafter, electrodes are formed at respective terminals to complete the device.

As shown in FIG. 22(d), there may be the case where the drain is withdrawn from a lower portion of the semiconductor substrate 1101. In that case, the drain contact diffused layer 1105 is formed over the entire back surface of the semiconductor substrate 1101.

However, in the above conventional method of manufacturing a semiconductor device having a DMOSFET, it has been difficult to reduce the on-resistance of the DMOSFET and suppress the activation of a parasitic bipolar transistor at the same time.

The on-resistance, which is the resistance between the source and drain of the DMOSFET when the DMOSFET is conducting, is desired to be low. To lower the on-resistance, however, the impurity concentration of the body diffused layer should be reduced, which may activate a parasitic NPN transistor using the source, body, drain of the DMOSFET as its emitter, base, and collector. This is because a substrate current Isub of the DMOSFET serves as a base current of the parasitic bipolar transistor, so that even an extremely small substrate current may activate the parasitic bipolar transistor if the impurity concentration of the body diffused layer is low.

On the other hand, if the impurity concentration of the body diffused layer is increased to suppress the activation of the parasitic transistor, the impurity concentration of the channel region near the surface of the body diffused layer is also increased, which increases the on-resistance. Moreover, the threshold voltage Vth of the DMOSFET is disadvantageously increased due to the increased impurity concentration of the body diffused layer.

SUMMARY OF THE INVENTION

A first object of the present invention is to provide a semiconductor device wherein a miniaturized and high-performance element such as a CMOSFET is reliably integrated with a DMOSFET on a single substrate at low cost by forming a body diffused layer of the DMOSFET without performing drive-in diffusion at high temperature, while the individual elements retain their characteristics, and a method of manufacturing the same.

A second object of the present invention is to suppress the activation of the parasitic bipolar transistor while reducing the on-resistance of the DMOSFET in a semiconductor device having a DMOSFET and a method of manufacturing the same.

To attain the above first object, a first semiconductor device of the present invention is implemented based on a semiconductor device having at least one DMISFET mounted in an active region of a semiconductor substrate surrounded by an isolation, wherein the above DMISFET comprises: a first impurity diffused layer formed by introducing an impurity of first conductivity type or impurity of second conductivity type at a low concentration into the above active region; a gate insulating film formed on said active region; a gate electrode formed on said gate insulating film; a source diffused layer formed by introducing the impurity of first conductivity type at a high concentration into a portion of the above active region located on one side of the above gate electrode; a drain diffused layer formed by introducing the impurity of first conductivity type at a high concentration into a portion of the above active region located on the other side of the above gate electrode to be surrounded by the above first impurity diffused layer; and a second impurity diffused layer formed by introducing the impurity of second conductivity type on a concentration level for threshold control into a portion surrounding the above source diffused layer and reaching a part of an area underlying the above gate electrode in the above active region, the above second impurity diffused layer being apart from the above drain diffused layer with intervention of the above first impurity diffused layer.

In the arrangement, when the first impurity diffused layer is formed by introducing the impurity of first conductivity type therein, the first impurity diffused layer functions as a part of the drain of the DMISFET and the region near the surface of the second impurity diffused layer containing the impurity of second conductivity type functions as the channel region of the DMISFET. On the other hand, when the first impurity diffused layer is formed by introducing the impurity of second conductivity type therein, the first impurity diffused layer functions as a part of the body diffused layer of the DMISFET in cooperation with the second impurity diffused layer and the regions near the surfaces of the first and second impurity diffused layers function as the channel region. In either case, a structure which does not require a high-temperature drive-in process for introducing the impurity of second conductivity type contained in the second impurity diffused layer into the region underlying the gate electrode is provided since the second impurity diffused layer is formed to reach the inside of the region underlying the gate electrode. Consequently, the impurity contained in the gate electrode of the DMOSFET is prevented from penetrating into the channel region of the DMISFET as a result of the high-temperature drive-in process, which prevents variations in the threshold of the DMISFET and a reduction in the reliability of the gate insulating film.

In the above first semiconductor device, the above second impurity diffused layer can be formed to have such a profile that a depth of penetration in the above semiconductor substrate is smaller in an area of the above active region underlying the above gate electrode than in the area of the above active region underlying the source diffused layer.

With the arrangement, the second impurity diffused layer extending to reach the inside of the region immediately below the gate electrode is obtained by implanting impurity ions at a normal tilt angle without performing the drive-in process at high temperature. Since the impurity concentration becomes particularly low in the portion of the second impurity diffused layer serving as the channel region, the threshold can be reduced, while the depth and impurity concentration of the second impurity diffused layer can be increased in the portion underlying the source diffused layer, so that the activation of the bipolar transistor is suppressed.

In the first semiconductor device, the above DMISFET can be further provided with a third impurity diffused layer formed by introducing the impurity of second conductivity type at a high concentration into an area of the above active region including a deep portion of the above second impurity diffused layer and not including the vicinity of a surface thereof.

In the arrangement, the base resistance of the parasitic bipolar transistor using the second impurity diffused layer containing the impurity of second conductivity type as the base and using the first impurity diffused layer containing the impurity of first conductivity type and the source diffused layer as the emitter and collector is reduced, since the third impurity diffused layer is connected to the base region. Consequently, the current amplification factor of the parasitic bipolar transistor is reduced, the activation of the parasitic bipolar transistor is suppressed, and the property of withstanding the voltage between the source and drain of the DMISFET is improved.

In the above first semiconductor device, the above first impurity diffused layer can be formed by introducing the impurity of second conductivity type therein such that at least the above first and second impurity diffused layers function as a body diffused layer.

The arrangement reduces the parasitic capacitance of the drain diffused layer of first conductivity type of the DMISFET, so that the operating speed of the DMISFET is increased. If the impurity concentration of the second impurity diffused layer is adjusted to be higher than the impurity concentration of the first impurity diffused layer, there can be obtained a high-voltage-withstand property.

There can further be provided a protective film formed on the above gate electrode and having a function of inhibiting the penetration of impurity ions.

In the arrangement, the impurity ions of second conductivity type being implanted to form the second impurity diffused layer penetrate into the gate electrode from the side face thereof to reach a portion of the region underlying the gate electrode at a given depth laterally away from the edge on the source side of the gate electrode, while the penetration of the impurity ions of second conductivity type from the top surface of the gate electrode is substantially inhibited. Consequently, the position and length of the channel region formed near the surface of the second impurity diffused layer are optimized.

It is also possible to mount a CMISFET composed of an NMISFET and a PMISFET on the first semiconductor device.

Since the arrangement does not require the high-temperature drive-in process in order to form the second impurity diffused layer of the DMISFET, the impurity for controlling the threshold of each MISFET in the CMISFET can be implanted prior to the formation of the gate electrodes. This eliminates the necessity for implanting the impurity for threshold control through the gate electrodes in forming the CMISFET, so that there is provided a semiconductor device on which the CMISFET exhibiting reduced threshold variations resulting from variations in the projected range of the impurity ions is mounted.

In that case, it is preferred that the gate insulating films of said first and second MISFETs are composed of the same material as that composing the gate insulating film of said DMISFET and have the same thickness as that of the gate insulating film of said DMISFET and that the gate electrodes of said first and second MISFETs are composed of the same material as that composing the gate electrode of said DMISFET and have the same thickness as that of the gate electrode of said DMISFET.

With the arrangement, the gate insulating films and gate electrodes of the DMISFET and CMISFET which have conventionally been composed of different structures can be formed in the same steps of film deposition and patterning, resulting in reduced cost and improved production yield.

To attain the above first object, a second semiconductor device of the present invention is implemented based on a semiconductor device having at least one DMISFET mounted in an active region of a semiconductor substrate surrounded by an isolation, wherein the above DMISFET comprises: a first impurity diffused layer formed by introducing an impurity of first conductivity type or impurity of second conductivity type at a low concentration into the above active region; a gate insulating film formed on the active region; a gate electrode formed on the above gate insulating film; insulator sidewalls formed on both side faces of the above gate electrode a source diffused layer formed by introducing the impurity of first conductivity type at a high concentration into a portion of the above active region located on one side of the above gate electrode and having the position of an edge thereof closer to the gate electrode determined by the above insulator sidewalls; a drain diffused layer formed by introducing the impurity of first conductivity type at a high concentration into a portion of the above active region located on the other side of the above gate electrode to be surrounded by the above first impurity diffused layer; and a second impurity diffused layer formed by introducing the impurity of second conductivity type on a concentration level for threshold control into a portion of the above active region surrounding the above source diffused layer and reaching a part of an area underlying the above gate electrode and having an edge thereof closer to the gate electrode determined by the edge on the source side of the above gate electrode.

In the arrangement, the length of the portion of the second impurity diffused layer forming the channel region, i.e., the length of the portion extending from the edge of the source diffused layer closer to the gate electrode to the edge of the second impurity diffused layer closer to the gate electrode is determined by the thickness of the sidewalls. Consequently, the threshold can be controlled without performing the high-temperature drive-in process so that the impurity in the gate electrode of the DMISFET is prevented from penetrating into the channel region of the DMISFET as a result of the high-temperature drive-in process, while variations in the threshold of the DMISFET and a reduction in the reliability of the gate insulating film are prevented. In addition, since ion implantation need not be performed at a large tilt angle in the resulting structure, it becomes possible to reduce the impurity concentration of the near-surface portion of the second impurity diffused layer forming the channel region, while increasing the impurity concentration of the portion of the second impurity diffused layer located deep into the substrate, so that the activation of the parasitic bipolar transistor is suppressed.

To attain the above second object, a third semiconductor device of the present invention is implemented based on a semiconductor device having at least one MISFET for high voltage mounted in an active region of a semiconductor substrate surrounded by an isolation, wherein the above MISFET for high voltage comprises: a gate insulating film formed on the above active region; a gate electrode formed on the above gate insulating film; a first impurity diffused layer formed by introducing an impurity of first conductivity type at a low concentration into a portion of the above active region including an area underlying one edge of the above gate electrode and an area extending laterally therefrom, the above first impurity diffused layer functioning as a drain; a source diffused layer formed by introducing the impurity of first conductivity type at a high concentration into a portion of the above active region laterally extending from the other edge of the above gate electrode; and a second impurity diffused layer formed by introducing an impurity of second conductivity type into an area of the above active region surrounding the above source diffused layer and including a portion forming a channel region underneath the above gate electrode and between the above source diffused layer and the above first impurity diffused layer such that an impurity concentration becomes higher in a deeper portion of the second impurity diffused layer.

In the arrangement, since a lower impurity concentration is provided in the near-surface portion of the second impurity diffused layer in which the channel region is to be formed is lower, the on-resistance of the MISFET for high voltage is reduced. On the other hand, since a higher impurity concentration is provided in the deeper portion of the second impurity diffused layer, the base resistance of the parasitic bipolar transistor is reduced, which suppresses the activation of the parasitic bipolar transistor in response to the extremely small substrate current in the DMISFET.

In the above third semiconductor device, the above second impurity diffused layer can be composed of a buried body diffused layer formed by introducing the impurity of second conductivity type at a higher concentration into a deep portion of the above semiconductor substrate and a body diffused layer formed by introducing the impurity of second conductivity type at a lower concentration into a portion shallower than the above buried body diffused layer of the above semiconductor substrate, the above buried body diffused layer and the above body diffused layer overlapping each other.

The arrangement can also reduce the on-resistance of the MISFET for high voltage and suppress the activation of the parasitic bipolar transistor.

In the above third semiconductor device, a buried drain diffused layer can further be formed by introducing the impurity of first conductivity type into a portion of the above second impurity diffused layer located at the depths of the above semiconductor substrate, the above buried drain diffused layer dividing the above second impurity diffused layer into upper and lower parts.

In the arrangement, since the second impurity diffused layer divided into the upper and lower parts with intervention of the buried drain diffused layer composes a Zener diode, a high-voltage surge from a load or the like is absorbed by the Zener diode, resulting in a high-surge-withstand property.

In the above third semiconductor device, it is also possible to further provide a PNP bipolar transistor, an NPN bipolar transistor, an NMISFET, a PMISFET, and the like.

To attain the above first object, a first method of manufacturing a semiconductor device of the present invention is implemented based on a method of manufacturing a semiconductor device having at least one DMISFET mounted in an active region of a semiconductor substrate surrounded by an isolation, the above method comprising: a first step of forming the isolation for defining the active region in the above semiconductor substrate; a second step of introducing an impurity of first conductivity type or impurity of second conductivity type into the above active region to form a first impurity diffused layer; a third step of forming a gate insulating film and a gate electrode of the DMISFET on the above active region; a fourth step of implanting ions of the impurity of second conductivity type into the above active region by using a mask member having an opening corresponding to a portion on the source side of the above active region to form a second impurity diffused layer extending from an area of the above active region underlying the above isolation to an area of the above active region underlying the above gate electrode; and a fifth step of implanting ions of the impurity of first conductivity type into respective portions of the active region located on both sides of the above gate electrode by using the above gate electrode as a mask to form a drain diffused layer of the DMISFET surrounded by the above first impurity diffused layer and a source diffused layer of the DMISFET surrounded by the above second impurity diffused layer.

According to the method, the second impurity diffused layer of the resulting DMISFET is formed simply through the implantation of the impurity ions of first conductivity type and through the activation thereof without performing the drive-in process at high temperature, so that the impurity is prevented from being diffused from the gate electrode into the channel region of the DMISFET. Hence, there can be formed a DMISFET exhibiting reduced threshold variations and having a highly reliable gate insulating film.

In the above first method of manufacturing a semiconductor device, in the above third step, the above insulating film and a conductive film can sequentially be deposited and a first resist film can be formed on the above conductive film to cover a region in which the gate electrode is to be formed such that a portion of the above conductive film underlying an opening of the first resist film is selectively removed and in the above fourth step, a second resist film having an opening corresponding to a portion on the source side of the above active region can be formed on the above first resist film such that the above first and second resist films are used as the above mask member.

The method enables the top surface of the gate electrode to have an enhanced function of blocking the impurity of second conductivity type for forming the second impurity diffused layer by utilizing the resist film used to form the gate electrode of the DMISFET.

In the above first method of manufacturing a semiconductor device, in the above third step, the above gate electrode can be formed to have such a thickness as to permit the ions of the above impurity of second conductivity type to penetrate therethrough in the above fourth step and in the above fourth step, the impurity of second conductivity type can be implanted to penetrate through the above gate electrode and to form the above second impurity diffused layer having such a profile that a depth of penetration in the above semiconductor substrate is smaller in an area of the above active region underlying the above gate electrode.

The method enables the impurity of second conductivity type to penetrate into the region underlying the gate electrode. Since the portion of the second impurity diffused layer forming the channel region has a lower impurity concentration, the threshold can be reduced. On the other hand, since the portion of the second impurity diffused layer underlying the source diffused layer has a larger depth and a higher impurity concentration, the activation of the bipolar transistor can be suppressed.

The above first method of manufacturing a semiconductor device can further comprise a step of implanting, after the above fourth step, the ions of the above impurity of second conductivity type into the above active region by using the same mask used in the above fourth step to form a third impurity diffused layer containing the impurity of second conductivity type at a higher concentration in an area including at least a part at the depths of the above second impurity diffused layer and located away from a surface of the above active region.

According to the method, the high-concentration third impurity diffused layer connected to a part of the second impurity diffusion is formed, so that the base resistance of the parasitic bipolar transistor produced between the second impurity diffusion, the source diffused layer, and the first impurity diffused layer is reduced, which suppresses the activation of the parasitic bipolar transistor. Consequently, the DMISFET having an improved property of withstanding the voltage between the source and drain is formed. Moreover, since ion implantation for forming the second impurity diffused layer has previously been performed at a large tilt angle, the semiconductor substrate has been turned amorphous to a certain degree before ion implantation for forming the third impurity diffused layer is performed, so that channelling is surely prevented even when ion implantation is performed at an angle close to 0°. Consequently, the third impurity diffused layer irregularly configured can be formed, which suppresses variations in threshold voltage.

In the above first method of manufacturing a semiconductor device, in the above second step, the impurity of second conductivity type can be implanted into the above active region to form the first impurity diffused layer functioning as a body diffused layer of the DMISFET in cooperation with the above second impurity diffused layer.

According to the method, the parasitic capacitance of the drain diffused layer of first conductivity type of the DMISFET is reduced, so that the DMISFET operable at a high speed is formed. If the impurity concentration of the second impurity diffused layer is adjusted to be higher than the impurity concentration of the first impurity diffused layer, the DMISFET exhibiting a high-voltage-withstand property can be obtained.

To attain the above first object, a second method of manufacturing a semiconductor device of the present invention is implemented based on a method of manufacturing a semiconductor device having at least one DMISFET mounted in an active region of a semiconductor substrate surrounded by an isolation, the above method comprising: a first step of forming the isolation for defining the active region in the above semiconductor substrate; a second step of introducing an impurity of first conductivity type or impurity of second conductivity type into the above active region to form a first impurity diffused layer; a third step of forming a gate insulating film and a gate electrode of the DMISFET on the above active region; a fourth step of implanting the ions of the impurity of second conductivity type into the above active region from a direction at a small tilt angle from a direction perpendicular to a surface of the semiconductor substrate by using, as a mask, a mask member having an opening corresponding to a portion on the source side of the above active region and the above gate electrode to form a second impurity diffused layer extending from an area of the above active region underlying the above isolation to an area of the above active region underlying an edge of the above gate electrode in the portion on the source side of the above active region; a fifth step of forming insulator sidewalls on both side faces of the above gate electrode; and a sixth step of implanting ions of the impurity of first conductivity type into respective portions of the active region located on both sides of the above gate electrode by using, as a mask, the above gate electrode and the insulator sidewalls to form a drain diffused layer of the DMISFET surrounded by the above first impurity diffused layer and a source diffused layer of the DMISFET surrounded by the above second impurity diffused layer.

By the method, the length of the portion of the second impurity diffused layer forming the channel region is determined by the thickness of the sidewalls even when the impurity of second conductivity type in the second impurity diffused layer is not introduced into the central portion of the region underlying the gate electrode, which facilitates the control of the threshold. Moreover, since the second impurity diffused layer is formed by ion implantation at a small tilt angle, it becomes possible to suppress the activation of the bipolar transistor by increasing the impurity concentration in the portion of the second impurity diffused layer located deep in the substrate, while reducing the impurity concentration in the near-surface portion of the second impurity diffused layer forming the channel region to lower the threshold.

In the above second method of manufacturing a semiconductor device, in the above fourth step, the ions of the above impurity of first conductivity type are preferably implanted from a direction at a tilt angle of 30° or less with respect to an axis perpendicular to the surface of the semiconductor substrate.

To attain the above second object, a third method of manufacturing a semiconductor device is implemented based on a method of manufacturing a semiconductor device having at least one MISFET for high voltage having a first-conductivity-type channel structure mounted on a semiconductor substrate, the above method comprising: a first step of introducing an impurity of second conductivity type into a part of a region of the above semiconductor substrate in which the MISFET for high voltage is to be formed to form a buried body diffused layer; a second step of forming an epitaxial layer of first conductivity type on the above semiconductor substrate formed with the above buried body diffused layer; a third step of diffusing the impurity of second conductivity type in the above buried body diffused layer upwardly into the epitaxial layer to change at least a part on the lower side of the above epitaxial layer into a part of the above buried body diffused layer of second conductivity type; a fourth step of introducing, into an upper portion of the above epitaxial layer, the impurity of second conductivity type at a concentration lower than in the above buried body diffused layer; a fifth step of forming a gate insulating film and a gate electrode on the above epitaxial layer such that an upper portion of the above buried body diffused layer is covered therewith; and a sixth step of introducing the impurity of first conductivity type into the above buried body diffused layer by using the above gate electrode as a mask to form a source diffused layer surrounded by the above buried body diffused layer.

By the method, the buried body diffused layer is formed by upwardly diffusing the impurity of second conductivity type so that the impurity concentration in a portion closer to the surface of the semiconductor substrate becomes lower than in a portion located deeper in the substrate. Consequently, there can be implemented the third semiconductor device described above which exhibits a low on-resistance and suppresses the activation of the parasitic bipolar transistor.

The following are two embodiments as more specific methods of forming the body diffused layer and the buried body diffused layer in the above third semiconductor device.

In the above fourth step, the diffusion of the impurity of second conductivity type in the buried body diffused layer may be performed continuedly from the above third step to form the buried body diffused layer reaching a surface of the substrate.

In the above fourth step, after the above fifth step, the impurity of second conductivity type at a concentration lower than in the above buried body diffused layer can be introduced into a portion overlying the above buried body diffused layer by using the above gate electrode as a mask to form a body diffused layer at least partially overlapping the above buried body diffused layer.

The above third method of manufacturing a semiconductor device can further comprise a step of introducing, prior to the above second step, the impurity of first conductivity type having a diffusion rate lower than the diffusion rate of the impurity of second conductivity type in the above buried body diffused layer into a region covering an upper portion of the above buried body diffused layer to form a buried drain diffused layer, wherein the above third step is performed such that the impurity of second conductivity type in the above buried body diffused layer is diffused upwardly through the above buried drain diffused layer and that the buried body diffused layer is divided into upper and lower parts by the buried drain diffused layer.

According to the method, the DMISFET having a Zener diode as described above can be formed.

To attain the above second object, a fourth method of manufacturing a semiconductor device of the present invention is implemented based on a method of manufacturing a semiconductor device having at least one MISFET for high voltage having a first-conductivity-type channel structure mounted in an active region of a semiconductor substrate, the above method comprising: a first step of introducing an impurity of first conductivity type into the above active region to form a drain diffused layer; a second step of forming a gate insulating film and a gate electrode on the above semiconductor substrate; a third step of implanting ions of an impurity of second conductivity type into a region of the above semiconductor substrate located on one side of the above gate electrode by using the above gate electrode as a mask to form a body diffused layer; a fourth step of implanting ions of the impurity of first conductivity type into the above body diffused layer by using the above gate electrode as a mask to form a source diffused layer surrounded by the above body diffused layer; and a fifth step of implanting the ions of the impurity of second conductivity type at a high concentration into a deep portion of the above body diffused layer by using the above gate electrode as a part of a mask to form a buried body diffused layer at least partially overlapping the above body diffused layer.

By the method, the buried body diffused layer having a higher impurity concentration is formed in a deeper portion of the substrate, while the body diffused layer having a lower impurity concentration is formed in a near-surface portion of the substrate without forming an epitaxial layer. Hence, there can be formed a semiconductor device having the DMISFET which exhibits a low on-resistance and suppresses the activation of the parasitic bipolar transistor mounted thereon at lower manufacturing cost.

BRIEF DESCRIPTION OF THE DRAWINGS

FIGS. 2(a) to 2(c) are cross-sectional views illustrating the second-half steps in the process of manufacturing a semiconductor device according to the first embodiment;

FIGS. 3(a) to 3(c) are cross-sectional views illustrating the second-half steps in a process of manufacturing a semiconductor device according to a second embodiment;

FIGS. 4(a) and 4(b) are cross-sectional views illustrating the steps of ion implantation for forming a P⁻ body diffused layer and a P⁺ body buried diffused layer in a process of manufacturing a semiconductor device according to a third embodiment;

FIGS. 10(a) to 10(c) are cross-sectional views illustrating the second-half steps in a process of manufacturing a semiconductor device according to a sixth embodiment;

FIGS. 19(a) to 19(e) are cross-sectional views illustrating a process of manufacturing a semiconductor device according to a thirteenth embodiment;

DETAILED DESCRIPTION OF THE INVENTION

First Embodiment

Figure 1:
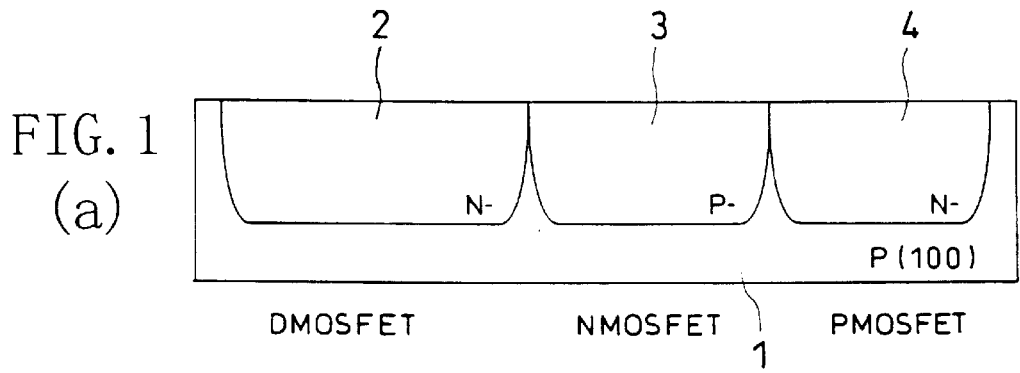
FIGS. 1(a) to 1(c) are cross-sectional views illustrating the first-half steps in a process of manufacturing a semiconductor device according to a first embodiment.
Figure 1:
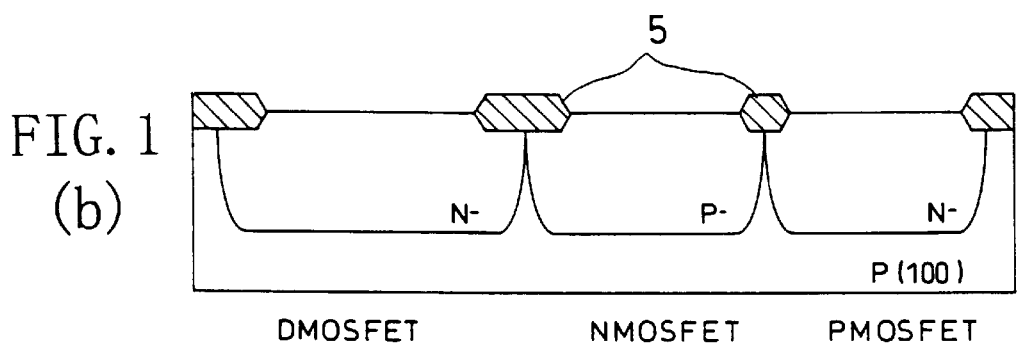
Figure 1:
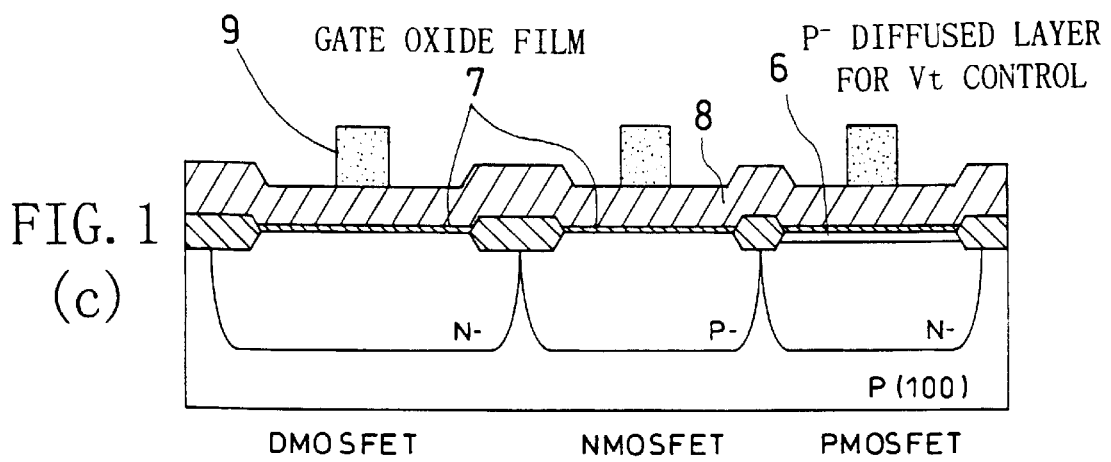

As shown in FIG. 1(a), a resist mask is formed on a P-type semiconductor substrate 1 made of polysilicon having a (100) plane as the main surface and a resistivity of 10 to 20 Ω·cm. By using the resist mask, phosphorus ions are implanted at energy of about 120 keV and a dose of about $8 \times 10^{12}/cm^{-2}$ into respective regions of the P-type semiconductor substrate 1 in which a DMOSFET and a PMOSFET are to be formed. Subsequently, another resist mask is formed and boron ions are implanted at energy of about 30 KeV and a dose of about $1 \times 10^{13}/cm^{-2}$, followed by a heat treatment at 1100° C. for about 100 minutes, thereby forming an N⁻ drain diffused layer 2 as a first impurity diffused layer of the DMOSFET, a P⁻-well diffused layer 3 of the NMOSFET, and an N⁻-well diffused layer 4 of the PMOSFET.

Next, as shown in FIG. 1(b), oxidation is performed at a temperature of about 900° C. to form an oxide film having a thickness of about 20 nm, followed by the formation of a nitride film having a thickness of about 160 nm by low-pressure CVD or like method at 760° C. Then, the nitride film except for the portions corresponding to the respective region in which the DMOSFET, NMOSFET, and PMOSFET are to be formed, is removed by dry etching using a resist mask, followed by the formation of an isolation 5 composed of a silicon dioxide film and having a thickness of 500 nm by, e.g., selective oxidation at 100° C.

Next, as shown in FIG. 1(c), BF$_2$ ions for threshold (hereinafter simply referred to as Vt) control are implanted at about 50 keV and 2×10$^{12}$/cm$^{-2}$ into the region in which the PMOSFET is to be formed by using a resist film as a mask to form a P$^-$ diffused layer 6 for Vt control. On the P$^-$ diffused layer 6 for Vt control, gate oxide films 7 having a thickness of about 15 nm are formed by oxidation at 900° C., followed by the formation of a polysilicon film 8 having a thickness of about 300 nm by low-pressure CVD or like method at 630° C. Subsequently, the polysilicon film 8 is changed into N$^+$ type by POCl$_3$ vapor phase diffusion at about 900° C. for about 30 minutes. Thereafter, a resist film 9 for forming gate electrodes is formed by a photolithographic process in the respective regions in which the DMOSFET, NMOSFET, and PMOSFET are to be formed.

Next, as shown in FIG. 2(a), the polysilicon film 8 is patterned by dry etching using the resist film 9 for forming gate electrodes as a mask to form a N$^+$ gate electrode 8a of the DMOSFET, an N$^+$ gate electrode 8b of the NMOSFET, and an N$^+$ gate electrode 8c of the PMOSFET. Then, by using a resist film 12 having an opening corresponding to the region in which the DMOS is to be formed and the N$^+$ gate electrode 8a of the DMOSFET as a mask, boron ions are implanted in two steps from two directions forming a plane angle of 180° C. therebetween into a region of the DMOSFET in which a body diffused layer is to be formed. In the first step, boron ions are implanted at about 120 keV and 4×10$^{13}$/cm$^{-2}$ and at a tilt angle of 30° from an axis perpendicular to the surface of the P-type semiconductor substrate 1 so that the boron ions are introduced into about one half on the source side of the region underlying the N$^+$ gate electrode 8a of the DMOSFET. In the second step, the semiconductor substrate 1 is rotated by 180 degrees before boron ions are implanted at a tilt angle of 30 so that the boron ions are introduced into the portion of the region in which the DMOSFET is to be formed underlying the edge portion of the isolation 5.

Next, as shown in FIG. 2(b), the resist film 12 is removed and a heat treatment is performed at about 850° C. for about 30 minutes to form a P$^-$ body diffused layer 14 as a second impurity diffused layer of the DMOSFET.

Next, as shown in FIG. 2(c), arsenic ions are implanted at about 40 keV and 4×10$^{15}$/cm$^{-2}$ into the respective regions in which the DMOSFET and NMOSFET are to be formed by using a resist film as a mask. Then, BF$_2$ ions are implanted at about 40 keV and 3×10$^{15}$/cm$^{-2}$ into the region in which the PMOSFET is to be formed, followed by a heat treatment at about 850° for about 60 minutes, thereby forming an N$^+$ source diffused layer 15, a channel region Rchan of the DMOSFET, and an N$^+$ drain diffused layer 16 of the DMOSFET, an N$^+$ source diffused layer 17 and an N$^+$ drain diffused layer 18 of the NMOSFET, and a P$^+$ source diffused layer 19 and a P$^+$ drain diffused layer 20 of the PMOSFET.

Thereafter, an NSG film having a thickness of about 800 nm is formed as an interlayer insulating film by low-pressure CVD or like method, which is then dry etched by using a resist film as a mask to form contact holes, though the drawing thereof is omitted in the present embodiment. Finally, an Al film is formed as metal interconnections by sputtering, which is then etched by using a resist film as a mask to form Al interconnections, thereby finishing the semiconductor device.

Thus, according to the present embodiment, boron ions are implanted in the first step at a tilt angle of 30° from an axis perpendicular to the surface of the P-type semiconductor substrate 1 by using the resist film 12 and the N$^+$ gate electrode 8a of the DMOSFET as a mask so as to form the P$^-$ body diffused layer 14 and the channel region Rchan of the DMOSFET and in the second step at such a tilt angle as to introduce the boron ions into the N$^+$ gate electrode 8a of the DMOSFET through the side face thereof which is closer to the source region and uncovered with the resist film 12. After that, a low-temperature heat treatment for activation is performed to form the P$^-$ body diffused layer 14 and channel region Rchan of the DMOSFET.

The formation of the semiconductor device on which the DMOSFET, NMOSFET, and PMOSFET having the foregoing structures are mounted achieves the following effects.

In forming the P$^-$ body diffused layer 14 and channel region Rchan of the DMOSFET, a high-temperature drive-in process which has conventionally been performed to sufficiently extend the body diffused layer in the lateral direction of the P-type semiconductor substrate 1 in forming the channel region underneath the gate electrode of the DMOSFET can be omitted, since ions are implanted at a large tilt angle into the P$^-$ body diffused layer 14. This is because the P$^-$ body diffused layer 14 can be extended sufficiently in the lateral direction of the semiconductor substrate only by ion implantation since ion implantation at a large tilt angle provides a sufficiently large projected range of the implanted ions in the lateral direction of the P-type semiconductor substrate, which facilitates the formation of the channel region Rchan underneath the gate electrode.

Therefore, the foregoing problems (1) to (3) can be solved by the following processes:

Solution to Problem (1)

In incorporating the mounting of the DMOSFET into the CMOS process, the high-temperature drive-in process becomes unnecessary after forming the respective gate electrodes of the DMOSFET, NMOSFET, and PMOSFET, so that ion implantation for the Vt control of the PMOSFET and NMOSFET can be performed prior to the formation of gate oxide films. Consequently, influences on the Vt control resulting from variations in the projected range of ions in the gate electrodes, the film quality and thickness of which are difficult to control, can completely be eliminated, since it is unnecessary to form the gate electrodes before ion implantation for the Vt control of the NMOSFET and PMOSFET is performed through the gate electrodes. Hence, it becomes possible to form an NMOSFET and a PMOSFET presenting reduced Vt variations even when a DMOSFET is mounted on a CMOS device.

Solution to Problem (2)

In incorporating the formation of the DMOSFET into the CMOS process, the heat treatment for the high-temperature drive-in process becomes unnecessary after forming the gate electrodes of the respective FETs, so that the impurity doping the gate electrode at a high concentration is not diffused into the gate oxide films of the individual FETs by the heat treatment. Hence, it becomes possible to provide highly reliable gate oxide films.

Second Embodiment

In a second embodiment, the steps preceding the step illustrated by FIG. 3(a) are the same as illustrated by FIGS. 1(a) to 1(c) and FIG. 2(a) in the first embodiment. Specifically, a resist film 12 is formed prior to the step illustrated by FIG. 3(a) so that boron ions are implanted in two steps from two directions forming a plane angle of 180° therebetween into a region of a DMOSFET in which a body diffused layer is to be formed by using the resist film 12 and an N$^+$ gate electrode 8a of the DMOSFET as a mask. In the first step, the boron ions are implanted at about 120 keV and $4 \times 10^{13}/cm^{-2}$ and at a tilt angle of 30° from an axis perpendicular to a surface of a P-type semiconductor substrate 1 so that the boron ions are introduced into about one half on the source side of the region underlying the N+ gate electrode 8a of the DMOSFET. In the second step, the semiconductor substrate 1 is rotated by 180 degrees before boron ions are implanted at a tilt angle of 30° so that the boron ions are introduced into the portion of the region in which the DMOSFET is to be formed underlying the edge portion of an isolation 5.

Next, as shown in FIG. 3(a), boron ions are implanted into a region of the DMOSFET in which a body diffused layer is to be formed by using again the resist film 12 and the N+ gate electrode 8a as a mask. The acceleration energy at which the boron ions are implanted is higher in the step illustrated by FIG. 3(a) than in the step illustrated by FIG. 2(a), while the tilt angle at which the boron ions are implanted is smaller in the step illustrated by FIG. 3(a) than in the step illustrated by FIG. 2(a). Specifically, the boron ions are implanted in the step illustrated by FIG. 3(a) at about 150 keV and $1 \times 10^{14}/cm^{-2}$ and at 0° from an axis perpendicular to the surface of the P-type semiconductor substrate 1.

Since the ions have been implanted obliquely to form a P− body diffused layer 14 prior to ion implantation for forming the P+ body buried diffused layer 32, the crystal in the semiconductor substrate has been turned amorphous to a certain degree. The ions are then implanted vertically to surely prevent channeling during ion implantation. Consequently, the configuration of the P+ body buried diffused layer 32 will not become irregular.

Next, as shown in FIG. 3(b), the resist film 12 is removed and a heat treatment is performed at about 850° C. for about 30 minutes to form the P− body diffused layer 14, a channel region Rchan, and a P+ body buried diffused layer 32 as a third impurity diffused layer of the DMOSFET. In this case, the edge in the lateral direction of the P+ body buried diffused layer 32 is located in the vicinity of the edge on the source side of the N+ gate electrode 8a of the DMOSFET. Since the P+ body buried diffused layer 32 is formed deeper into the semiconductor substrate 1 than the P− body diffused layer 14, the surface concentration of the P− body diffused layer 14 immediately below the N+ gate electrode 8a of the DMOSFET is barely influenced by the P+ body buried diffused layer 32. Hence, the Vt of the DMOSFET is determined only by the P− body diffused layer 14 without being influenced by the P− body buried diffused layer 32.

Next, as shown in FIG. 3(c), arsenic ions are implanted at about 40 keV and $4 \times 10^{15}/cm^{-2}$ into the respective regions in which the DMOSFET and NMOSFET are to be formed by using a resist film as a mask. Then, $BF_2$ ions are implanted at about 40 keV and $3 \times 10^{15}/cm^{-2}$ into the region in which the PMOSFET is to be formed and a heat treatment is subsequently performed at about 850° C. for about 60 minutes to form an N+ source diffused layer 15 and an N+ drain diffused layer 16 of the DMOSFET, an N+ source diffused layer 17 and an N+ drain diffused layer 18 of the NMOSFET, and a P+ source diffused layer 19 and a P+ drain diffused layer 20 of the PMOSFET.

Thereafter, an NSG film having a thickness of about 800 nm is formed as an interlayer insulating film by low-pressure CVD or like method, which is then dry etched by using the NSG film as a mask to form contact holes, though the drawing thereof is omitted in the present embodiment. Finally, an Al film is formed as metal interconnections by sputtering, which is then etched by using a resist film as a mask to form Al interconnections, thereby finishing the semiconductor device.

In the present embodiment also, boron ions are implanted in a step equivalent to the foregoing step illustrated by FIG. 2(a) at a tilt angle of 30° from a normal to the P-type semiconductor substrate 1 and then at such a tilt angle as to introduce the boron ions into the N+ gate electrode 8a of the DMOSFET through the side face thereof which is closer to the source region and uncovered with the resist film 12 so as to form the P− body diffused layer 14 and channel region Rchan of the DMOSFET. Consequently, the present embodiment can also achieve the same effects as achieved in the above first embodiment.

After that, a low-temperature heat treatment for activation is performed to form the P− body diffused layer 14, channel region Rchan, and P+ body buried diffused layer 32 of the DMOSFET.

Thus, since the P+ body buried diffused layer 32 as the third impurity diffused layer containing the P-type impurity at a higher concentration is formed below the P− body diffused layer 14 of the DMOSFET, the overall resistance of the body diffused layer can be lowered. Accordingly, even when the threshold voltage is lowered by reducing the surface concentration of the P− body diffused layer 14 to improve the performance of the DMOSFET, the overall resistance of the body diffused layer 14 is suppressed due to the high-concentration P+ body buried diffused layer 32. The overall resistance of the body diffused layer 14 which has been lowered suppresses variations in threshold voltage resulting from an increase in potential at a body terminal induced by the substrate current of the DMOSFET. In particular, even when a parasitic bipolar NPN transistor using the body diffused layer 14 as the base, the N+ source diffused layer 15 as the emitter, and the N− drain diffused layer 2 as the collector is produced, the resistance thereof becomes low since the impurity concentration in the portion corresponding to the base is high, so that the activation of the transistor is suppressed. As a result, the property of withstanding the voltage between the source and drain is improved.

In addition, the present embodiment has formed the P− body diffused layer 14 and the channel region Rchan by thus implanting the ions at a large tilt angle of 30° and then formed the P+ body buried diffused layer 32 by implanting the boron ions into the region of the DMOSFET in which the body diffused layer is to be formed at acceleration energy higher than used in the first boron implantation and at a tilt angle of 0° from a normal to the P-type semiconductor substrate 1. Since the inside of the semiconductor substrate has been turned amorphous at a certain degree by the first ion implantation at a large tilt angle, channeling is barely observed even when ions are implanted vertically afterwards to form the P+ body buried diffused layer 32, which prevents the impurity from being randomly distributed by the subsequent impurity diffusion process. In short, variations in high-voltage-withstand property and electric property are prevented. However, in the case where ions are implanted vertically to form the P+ body buried diffused layer 32 prior to ion implantation at a large tilt angle, the impurity is irregularly distributed in the semiconductor substrate by channeling and the irregularly distributed impurity is further diffused in the semiconductor substrate, so that variations in high-voltage-withstand property and electric property are disadvantageously increased.

Since the respective ion implantations for forming the body diffused layer 14 and the P+ body buried diffused layer 32 are performed by using the same mask, it is sufficient to add one extra ion implantation step in order to achieve the effect at slightly increased cost.

Third Embodiment

In the third embodiment, the steps preceding the step illustrated by FIG. 4(c) are substantially the same as the steps illustrated by FIGS. 1(a) to 1(c) in the above first embodiment. In the present embodiment, however, the resist film 9 for forming gate electrodes is not removed prior to the step illustrated by FIG. 4(a) but a new resist film 12 is formed thereon so that boron ions are implanted in two steps from two directions forming a plane angle of 180° therebetween into a region of the DMOSFET in which a body diffused layer is to be formed by using the resist films 9 and 12 and the N$^+$ gate electrode 8a of the DMOSFET as a mask. In the first step, the boron ions are implanted at about 120 keV and $4\times10^{13}/cm^{-2}$ and at a tilt angle of 30° from an axis perpendicular to a surface of the P-type semiconductor substrate 1 so that the boron ions are introduced into about one half on the source side of the region underlying the N$^+$ gate electrode 8a of the DMOSFET. In the second step, the boron ions are implanted at a tilt angle of 30° after the semiconductor substrate 1 is rotated by 180 degrees so that the boron ions are introduced into a portion of the region in which the DMOSFET is to be formed underlying the edge portion of an isolation 5.

Then, as shown in FIG. 4(b), boron ions are implanted into a region of the DMOSFET in which a body diffused layer is to be formed by using again the resist films 9 and 12 and the N$^+$ gate electrode 8a of the DMOSFET as a mask. The acceleration energy at which the boron ions are implanted is higher in the step illustrated by FIG. 4(b) than in the step illustrated by FIG. 10, while the tilt angle from an axis perpendicular to the surface of the P-type semiconductor substrate 1 at which the boron ions are implanted is smaller in the step illustrated by FIG. 4(b) than in the step illustrated by FIG. 10. Specifically, the boron ions are implanted in the step illustrated by FIG. 4(b) at about 150 keV and $1\times10^{14}/cm^{-2}$ and at a tilt angle of 0° from the axis perpendicular to the surface of the P-type semiconductor substrate 1.

Figure 5:
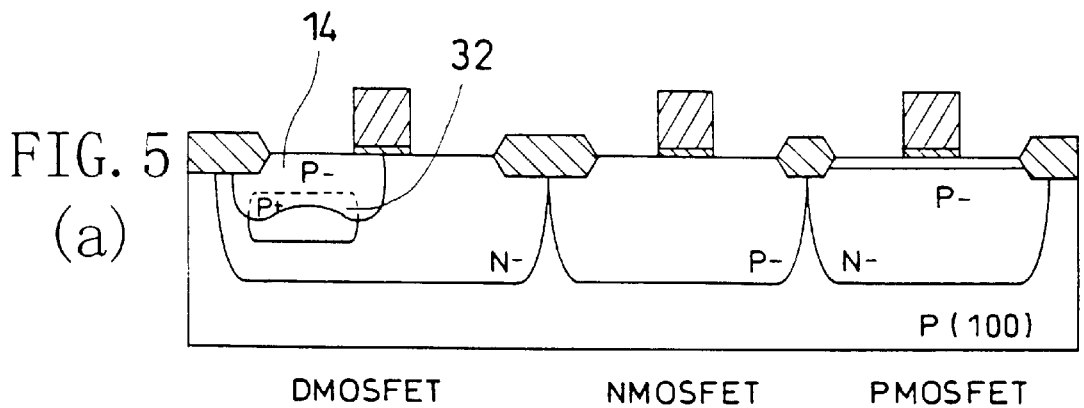
FIGS. 5(a) and 5(b) are cross-sectional views illustrating the steps of forming gate electrodes and source/drain diffused layers in the process of manufacturing a semiconductor device according to the third embodiment.
Figure 5:
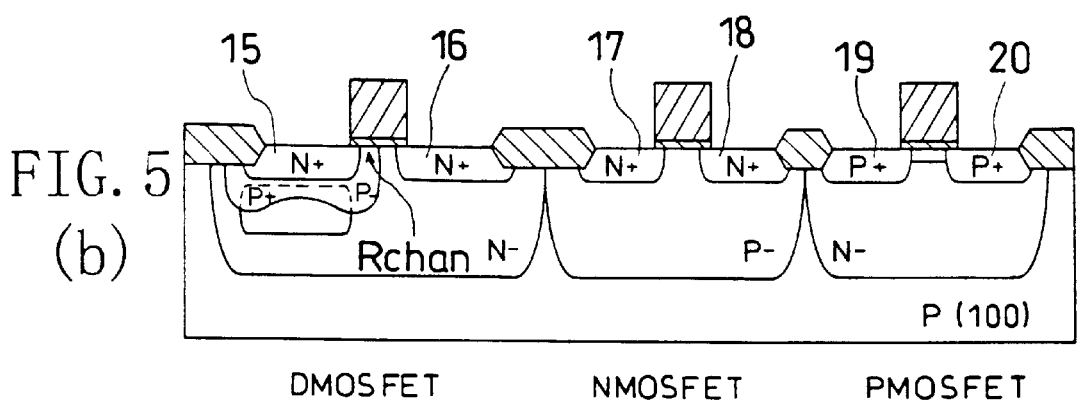

Next, as shown in FIG. 5(a), the resist films 9 and 12 are removed and a heat treatment is performed at about 850° C. for about 30 minutes to form a P$^-$ body diffused layer 14, a channel region Rchan, and a P$^+$ body buried diffused layer 32 of the DMOSFET. In this case, the edge in the lateral direction of the P$^+$ body buried diffused layer 32 is located in the vicinity of the edge on the source side of the N$^+$ gate electrode 8a of the DMOSFET. The P$^+$ body buried diffused layer 32 is formed deeper into the semiconductor substrate 1 than the P$^-$ body diffused layer 14 so that the surface concentration of the P$^-$ body diffused layer 14 immediately below the N$^+$ gate electrode 8a of the DMOSFET is barely influenced by the P$^+$ body buried diffused layer 32. Hence, the Vt of the DMOSFET is determined only by the P$^-$ body diffused layer 14 without being influenced by the P$^+$ body buried diffused layer 32.

Next, as shown in FIG. 5(b), arsenic ions are implanted at about 40 keV and $4\times10^{15}/cm^{-2}$ into the respective regions in which the DMOSFET and NMOSFET are to be formed by using a resist film or the like as a mask. Then, BF$_2$ ions are introduced at about 40 keV and $3\times10^{15}/cm^{-2}$ into the region in which the PMOSFET is to be formed and a heat treatment is subsequently performed at about 850° C. for about 60 minutes to form an N$^+$ source diffused layer 15 and an N$^+$ drain diffused layer 16 of the DMOSFET, an N$^+$ source diffused layer 17 and an N$^+$ drain diffused layer 18 of the NMOSFET, and a P$^+$ source diffused layer 19 and a P$^+$ drain diffused layer 20 of the PMOSFET.

Thereafter, an NSG film having a thickness of about 800 nm is formed as an interlayer insulating film by low-pressure CVD or like method, which is then dry etched by using a resist film as a mask to form contact holes, though the drawing thereof is omitted in the present embodiment. Finally, an Al film is formed as metal interconnections by sputtering, which is then etched by using a resist film or the like as a mask to form Al interconnections, thereby finishing the semiconductor device.

The tilt angle and acceleration energy at which the boron ions are implanted to form the P$^-$ body diffused layer 14 and the channel region Rchan in the present embodiment are the same as used in the above second embodiment. Moreover, since the P$^+$ body diffusion buried layer 32 is also formed afterwards in the present embodiment, similarly to the above second embodiment, the present embodiment can achieve basically the same effects as achieved by the above second embodiment.

Furthermore, to form the P$^-$ body diffused layer 14 and P$^+$ body buried diffused layer 32 of the DMOSFET, the present embodiment has used, as a mask, not only the resist film 12 and the N$^+$ gate electrode 8a of the DMOSFET but also the resist film 9 for forming gate electrodes used to form the N$^+$ gate electrode 8a of the DMOSFET. Consequently, even when a mask misalignment occurs between the resist film 12 and the N$^+$ gate electrode 8a of the DMOSFET, boron ions are blocked by the resist film 9 for forming gate electrodes on the N$^+$ gate electrode 8a of the DMOSFET, so that the boron ions will not penetrate through the N$^+$ gate electrode 8a of the DMOSFET from the top surface thereof as in the case where no resist film 12 is provided. As a result, the boron ions implanted into the region underlying the N$^+$ gate electrode 8a travel laterally to reach points substantially equidistant from the edge on the source side of the N$^+$ gate electrode 8a, so that variations in gate length, i.e., the length of the channel region Rchan between the N$^+$ source diffused layer 15 and the N$^-$ drain diffused layer are suppressed advantageously.

Fourth Embodiment

Figure 6A:
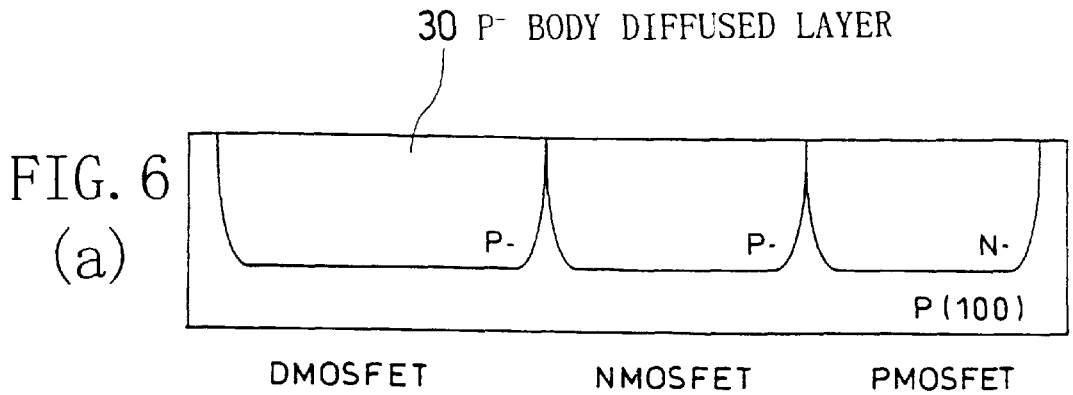
FIGS. 6(a) to 6(c) are cross-sectional views illustrating the first-half steps in a process of manufacturing a semiconductor device according to a fourth embodiment.
Figure 6B:
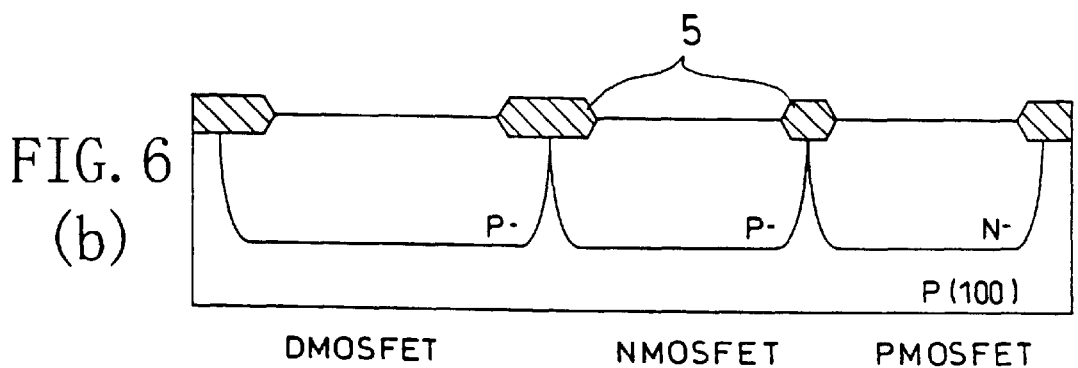
Figure 6C:
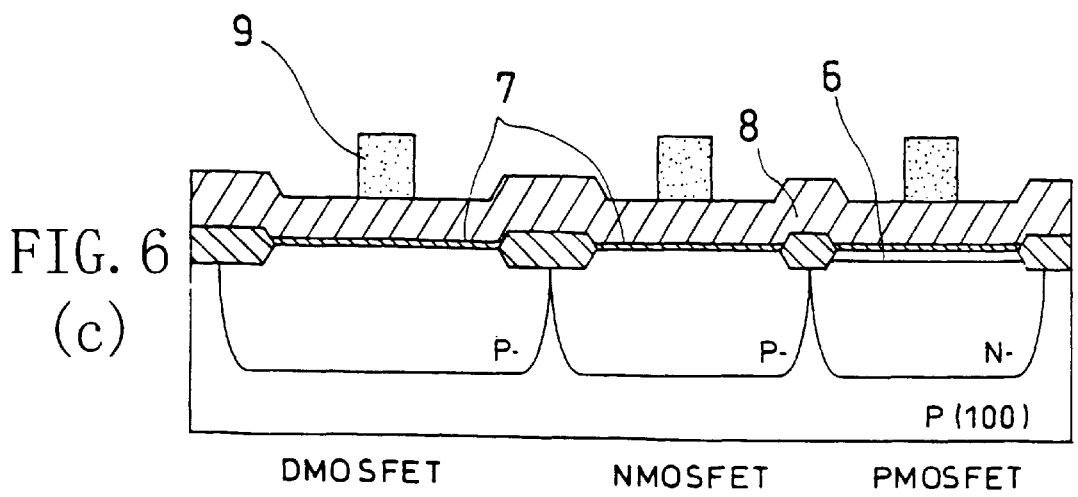
Figure 7A:
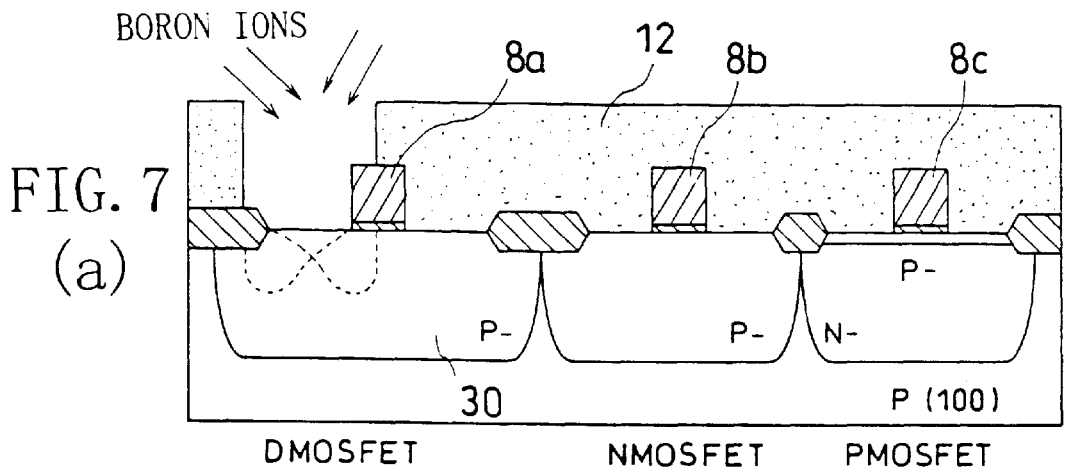
FIGS. 7(a) to 7(c) are cross-sectional views illustrating the second-half steps in the process of manufacturing a semiconductor device according to the fourth embodiment.
Figure 7B:
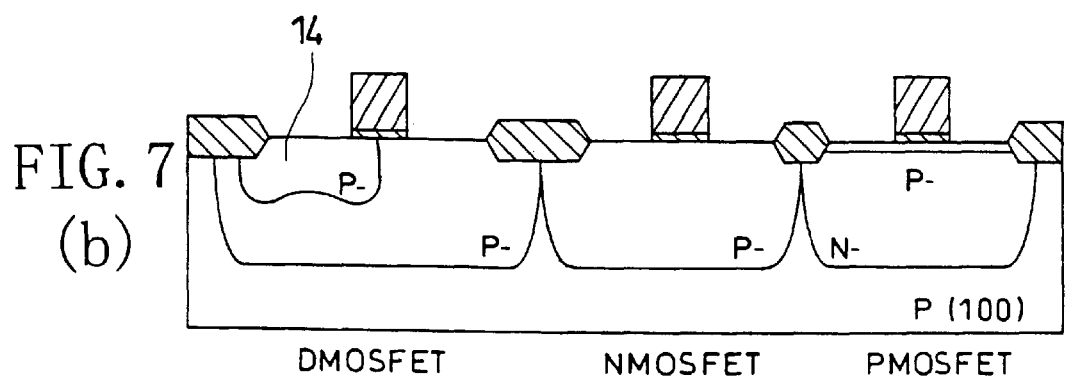
Figure 7C:
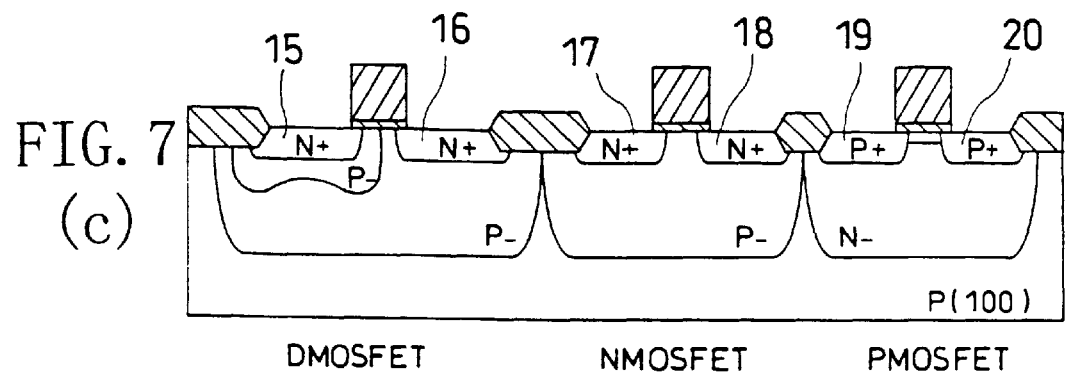

The respective steps illustrated by FIGS. 6(a) to 6(c) are basically the same as the steps illustrated by FIGS. 1(a) to 1(c) and FIGS. 2(a) to 2(c) in the above first embodiment. In the present embodiment, however, a P-type impurity is introduced into the first impurity diffused layer surrounding an N$^+$ drain diffused layer 16 and a P$^-$ body diffused layer 14 of the DMOSFET to form a P$^-$ body diffused layer 30 at an extremely low concentration. As a result, the body diffused layer is composed of the two P$^-$ body diffused layers 30 and 14. The P$^-$ body diffused layer 30 contains the impurity on the order of $10^{16}$ cm$^{-3}$, while the P$^-$ body diffused layer 14 contains the impurity on the order of $10^{17}$ cm$^{-3}$.

Thus, by forming the P$^-$ body diffused layer 14 at a low concentration in the P$^-$ body diffused layer 30 at a lower concentration, the high-voltage-withstand property of the DMOSFET is improved. Since the N$^+$ drain diffused layer 16 is surrounded by the P$^-$ layer, the parasitic capacitance of the N$^+$ drain diffused layer 16 is reduced and the operating speed of the DMOSFET is increased.

Fifth Embodiment

Figure 8A:
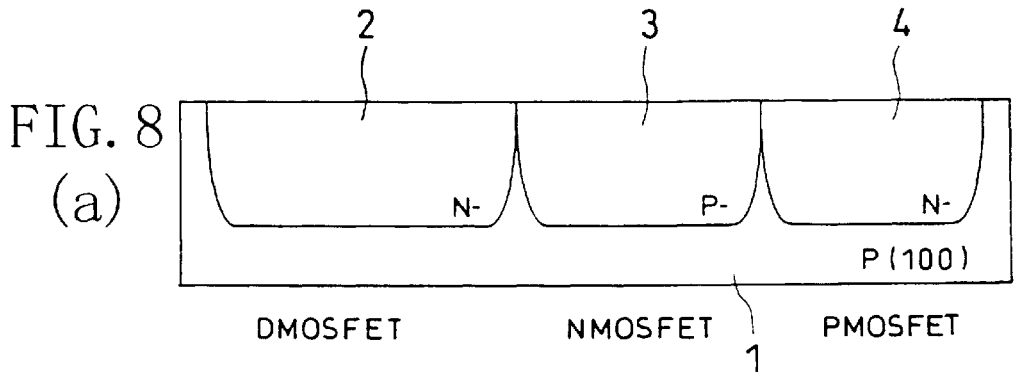
FIGS. 8(a) to 8(c) are cross-sectional views illustrating the first-half steps in a process of manufacturing a semiconductor device according to a fifth embodiment.
Figure 8B:
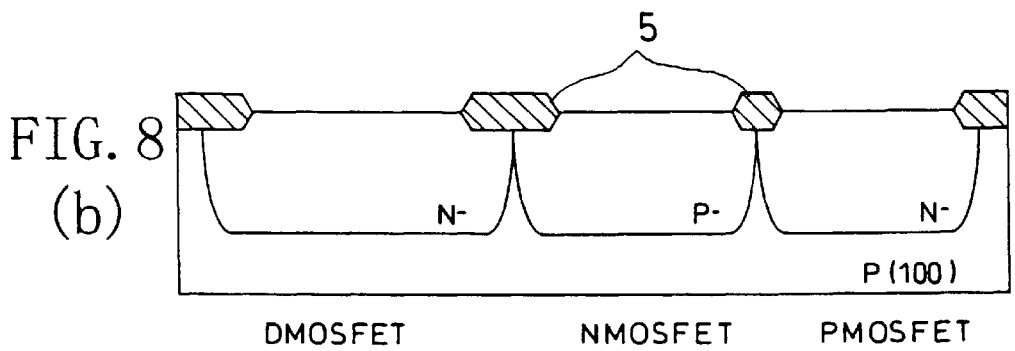
Figure 8C:
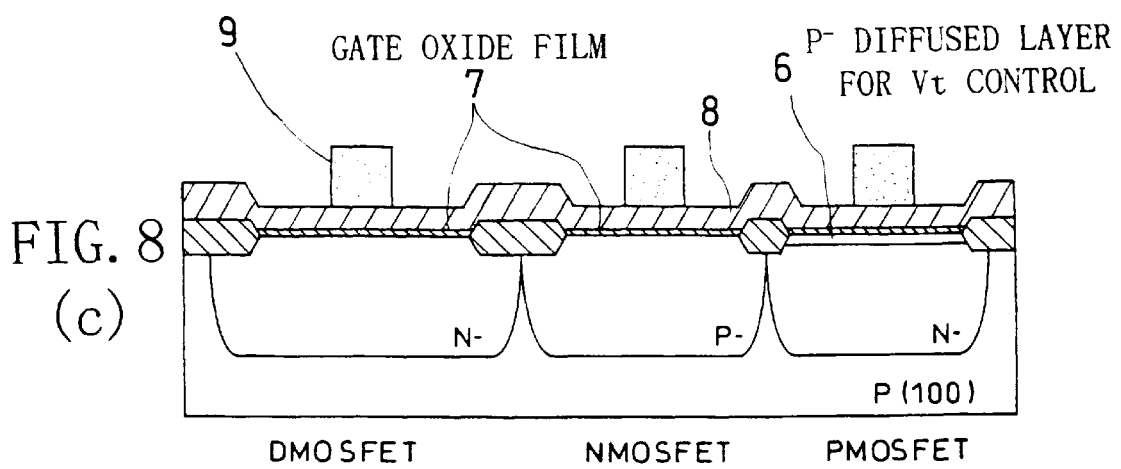

The respective steps illustrated by FIGS. 8(a) to 8(c) are basically the same as the steps illustrated by FIGS. 1(a) to 1(c) in the above first embodiment. Specifically, an N⁻ drain diffused layer 2 as the first impurity diffused layer of a DMOSFET, a P⁻-well diffused layer 3 of an NMOSFET, and an N⁻-well diffused layer 4 of a PMOSFET are individually formed in a P-type semiconductor substrate 1, followed by the formation of an isolation 5 for defining respective regions in which the DMOSFET, NMOSFET, and PMOSFET are to be formed. Then, a P⁺ diffused layer 6 for Vt control is formed in the region in which the PMOSFET is to be formed. After gate oxide films 7 are formed on the surfaces of the respective regions of the P-type semiconductor substrate 1, a polysilicon film 8 is formed over the entire surface of the substrate. On the polysilicon film 8, a resist film 9 for forming gate electrodes is formed to cover the respective regions of the DMOSFET, NMOSFET, and PMOSFET in which the gate electrodes are to be formed. The present embodiment uses the polysilicon film 8 with a thickness of about 200 nm, which is thinner than the polysilicon film 8 with a thickness of 300 nm used in the first embodiment.

Figure 9:
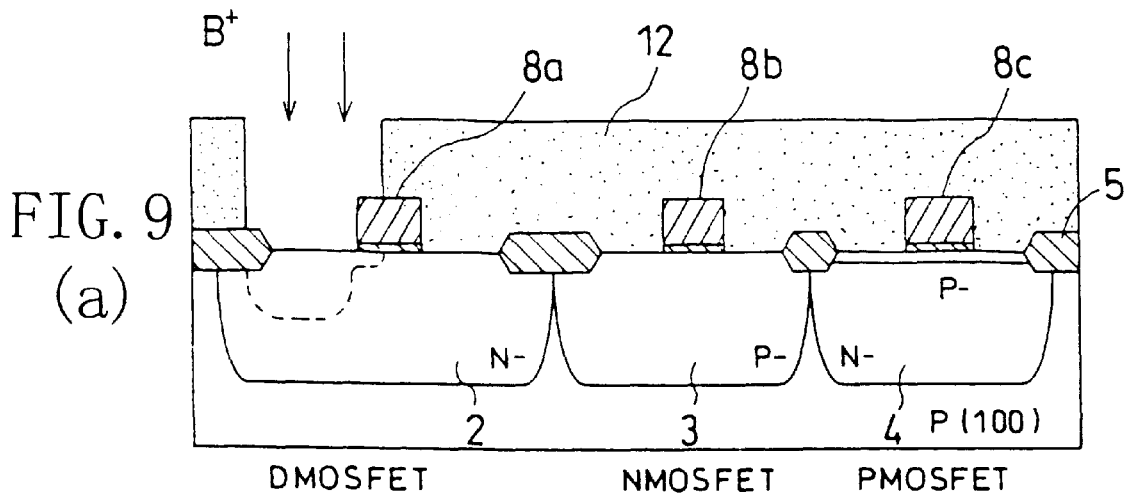
FIGS. 9(a) to 9(c) are cross-sectional views illustrating the second-half steps in the process of manufacturing a semiconductor device according to the fifth embodiment.
Figure 9:
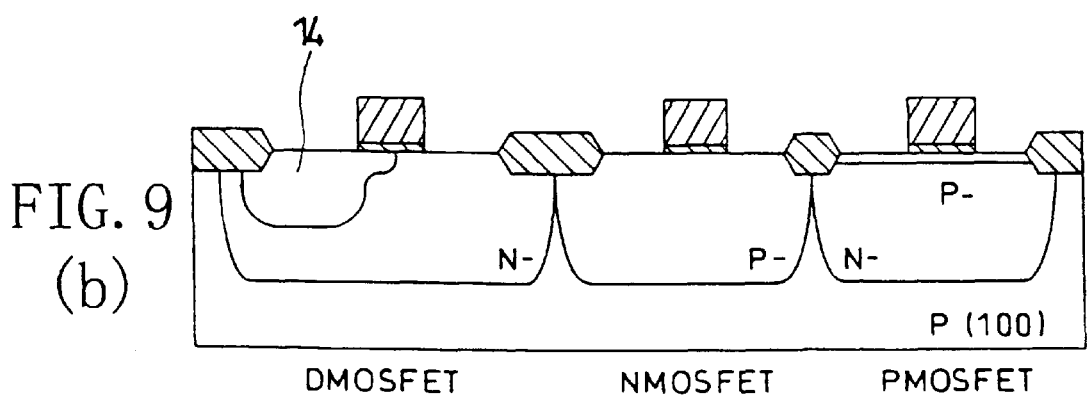
Figure 9:
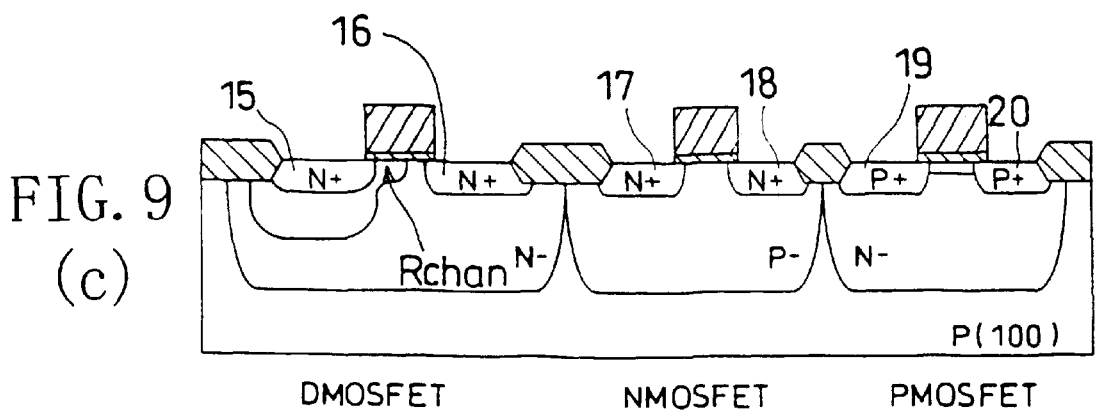

Next, as shown in FIG. 9(a), the polysilicon film 8 is patterned by dry etching using the resist film 9 for forming gate electrodes as a mask to form an N⁺ gate electrode 8a of the DMOSFET, an N⁺ gate electrode 8b of the NMOSFET, and an N⁺ gate electrode 8c of the PMOSFET. Thereafter, boron ions are implanted in one step into a region of the DMOSFET in which a body diffused layer is to be formed by using the resist film 12 with an opening corresponding to the region of the DMOSFET in which the source is to be formed and the N⁺ gate electrode 8a of the DMOSFET as a mask. In this step, the boron ions are implanted at 140 keV and $4 \times 10^{13}/\text{cm}^{-2}$ and at a tilt angle of 7° from an axis perpendicular to the surface of the P-type semiconductor substrate 1 so that the boron ions are introduced into about one half on the source side of the region underlying the N⁺ gate electrode 8a of the DMOSFET. In this step, the boron ions penetrate through the N⁺ gate electrode 8a composed of a thin polysilicon film (200 nm).

Next, as shown in FIG. 9(b), the resist film 12 is removed and a heat treatment is performed at about 850° C. for about 30 minutes to form a P⁻ body diffused layer 14 as the second impurity diffused layer of the DMOSFET.

Next, as shown in FIG. 9(c), arsenic ions are implanted at about 40 keV and $4 \times^{15}/\text{cm}^{-2}$ into the respective regions in which the DMOSFET and NMOSFET are to be formed by using a resist film as a mask. Then, BF₂ ions are implanted at about 40 keV and $3 \times 10^{15}/\text{cm}^{-2}$ into the region in which the PMOSFET is to be formed and a heat treatment is subsequently performed at about 850° C. for about 60 minutes to form an N⁺ source diffused layer 15, a channel region Rchan, and an N⁺ drain diffused layer 16 of the DMOSFET, an N⁺ source diffused layer 17 and an N⁺ drain diffused layer 18 of the NMOSFET, and a P⁺ source diffused layer 19 and a P⁺ drain diffused layer 20 of the PMOSFET.

Thereafter, an NSG film having a thickness of about 800 nm is formed as an interlayer insulating film by low-pressure CVD or like method, which is then dry etched by using a resist film as a mask to form contact holes, though the drawing thereof is omitted in the present embodiment. Finally, an Al film is formed as metal interconnection by sputtering, which is then etched by using a resist film as a mask to form Al interconnections, thereby finishing the semiconductor device.

In the present embodiment, the boron ions are implanted by using the resist film 12 as a mask to form the P⁻ body diffused layer 14 and channel region Rchan of the DMOSFET, so that the P⁻ body diffused layer 14 is formed similarly to the above first embodiment except that the edge of the channel region Rchan is configured to form a shallow junction extending toward the drain diffused layer. This is because the thin N⁺ gate electrode 8a is formed prior to the implantation of the boron ions so that the impurity ions penetrate through the thin N⁺ gate electrode 8a during ion implantation.

Unlike the conventional method, the semiconductor device on which the DMOSFET, NMOSFET, and PMOSFET thus constructed are mounted according to the present embodiment does not require a high-temperature drive-in process whereby the impurity injected into the edge portion of the region underlying the gate electrode is diffused in the lateral direction along the region immediately below the gate electrode. Hence, the present embodiment can solve the conventional problems (1) and (2), similarly to the first embodiment. In addition, the present embodiment can achieve the following remarkable effects.

As described above, the channel region Rchan of the DMOSFET is formed by the impurity ions implanted through the N⁺ gate electrode 8a. Consequently, even when the dose and energy for ion implantation are increased, the impurity concentration in the channel region Rchan of the P⁻ body diffused layer 14 is suppressed so that the threshold is reduced. On the other hand, the depth and impurity concentration of the P⁻ body diffused layer 14 are increased in the portion underneath the N⁺ source diffused layer 15 by increasing the dose and energy for ion implantation, so that the activation of a parasitic bipolar transistor can be suppressed advantageously.

In the case of the DMOSFET, a slight change in the depth of the P⁻ body diffused layer 14 exerts a minimal influence on the threshold Vt, so that variations in the threshold of the PMOSFET having the buried channel structure described in the foregoing problem (1) are substantially negligible.

Sixth Embodiment

In the present embodiment, the same steps as those illustrated by FIGS. 8(a) to 8(c) and FIG. 9(a) in the above fifth embodiment are performed prior to the step illustrated by FIG. 10(a). Specifically, an N⁻ drain diffused layer 2 as the first impurity diffused layer of a DMOSFET, a P⁻-well diffused layer 3 of an NMOSFET, and an N⁻-well diffused layer 4 of a PMOSFET are formed in a P-type semiconductor substrate 1, followed by the formation of an isolation 5 for defining respective regions in which the DMOSFET, NMOSFET, and PMOSFET are to be formed. Then, a P⁻ diffused layer 6 for Vt control is formed in the region in which the PMOSFET is to be formed. After gate oxide films 7 are formed on the surfaces of the respective regions of the P-type semiconductor substrate 1, there are formed an N⁺ gate electrode 8a of the DMOSFET, an N⁺ gate electrode 8b of the NMOSFET, and an N⁺ gate electrode 8c of the PMOSFET, each composed of a polysilicon film having a thickness of 200 nm. Subsequently, boron ions are implanted in one step into the region of the DMOSFET in which a body diffused layer is to be formed. In this step, the boron ions are implanted by using, as a mask, the resist film 12 with an opening corresponding to the region in which the source of the DMOSFET is to be formed and the N⁺ gate electrode 8a of the DMOSFET shown in FIG. 10(a). In the present embodiment also, the boron ions are implanted under the same conditions as used in the above fifth embodiment. In the present embodiment also, the boron ions penetrate through the N⁺ gate electrode 8a composed of a thin polysilicon film (200 nm) to be implanted into about one half on the source side of the region underlying the N⁺ gate electrode 8a, similarly to the above fifth embodiment. Hence, the boron ions are implanted shallow into about one half on the source side of the region underlying the N⁺ gate electrode 8a.

After the foregoing steps are performed, boron ions are implanted into the region of the DMOSFET in which the body diffused layer is to be formed by using, as a mask, the same resist mask 12 used in the above step and the N⁺ gate electrode 8a of the DMOSFET at high acceleration energy of about 150 keV and a dose of $1\times10^{14}/cm^{-2}$ and at a small tilt angle, for example, of 0° from an axis perpendicular to the surface of the P-type semiconductor substrate 1.

Next, as shown in FIG. 10(b), the resist film 12 is removed and a heat treatment is performed at about 850° C. for about 30 minutes to form a P⁻ body diffused layer 14, a channel region Rchan, and a P⁺ body buried diffused layer 32 as the third impurity diffused layer of the DMOSFET. In this case, the edge in the lateral direction of the P⁺ body buried diffused layer 32 lies in the roughly central portion of the N⁺ gate electrode 8a of the DMOSFET. The P⁺ body buried diffused layer 32 is formed deeper into the semiconductor substrate 1 than the P⁺ body diffused layer 14 so that the surface concentration of the P⁻ body diffused layer 14 immediately below the N⁺ gate electrode 8a is barely influenced by the P⁺ body buried diffused layer 32. Hence, the Vt of the DMOSFET is determined only by the P⁻ body diffused layer 14 without being influenced by the P⁺ body buried diffused layer 32.

Since the ions have been implanted to form the P⁻ body diffused layer 14 prior to ion implantation for the formation of the P⁺ body buried diffused layer 32, the crystal in the semiconductor substrate has been turned amorphous to a certain degree. The ions are then implanted vertically to surely prevent channeling during ion implantation. Consequently, the configuration of the P⁺ body buried diffused layer 32 will not become irregular.

Next, as shown in FIG. 10(c), arsenic ions are implanted at about 40 keV and $4\times10^{15}/cm^{-2}$ into the regions in which the DMOSFET and NMOSFET are to be formed by using a resist film as a mask. Then, BF₂ ions are implanted at about 40 keV and $3\times10^{15}/cm^{-2}$ into the region in which the PMOSFET is to be formed and a heat treatment is subsequently performed at about 850° C. for about 60 minutes to form an N⁺ source diffused layer 15 and an N⁺ drain diffused layer 16 of the DMOSFET, an N⁺ source diffused layer 17 and an N⁺ drain diffused layer 18 of the NMOSFET, and a P⁺ source diffused layer 19 and a P⁺ drain diffused layer 20 of the PMOSFET.

Thereafter, an NSG film having a thickness of about 800 nm is formed as an interlayer insulating film by low-pressure CVD or like method, which is then dry etched by using a resist film as a mask to form contact holes, though the drawing thereof is omitted in the present embodiment. Finally, an Al film is formed as metal interconnections by sputtering, which is then etched by using a resist film as a mask to form Al interconnections, thereby finishing the semiconductor device.

In the present embodiment also, the edge of the channel region Rchan is configured to form a shallow junction extending toward the drain diffused layer, similarly to the above fifth embodiment. Hence, the present embodiment can achieve the same effects as achieved by the above fifth embodiment. In addition, the present embodiment can improve the property of withstanding the voltage between the source and drain since the activation of the parasitic bipolar transistor is suppressed.

Since the respective ion implantations for forming the body diffused layer 14 and the P⁺ body buried diffused layer 32 are performed using the same mask, it is sufficient to add one extra step of ion implantation, so that the effect is achieved at slightly increased cost.

Seventh Embodiment

Figure 11:
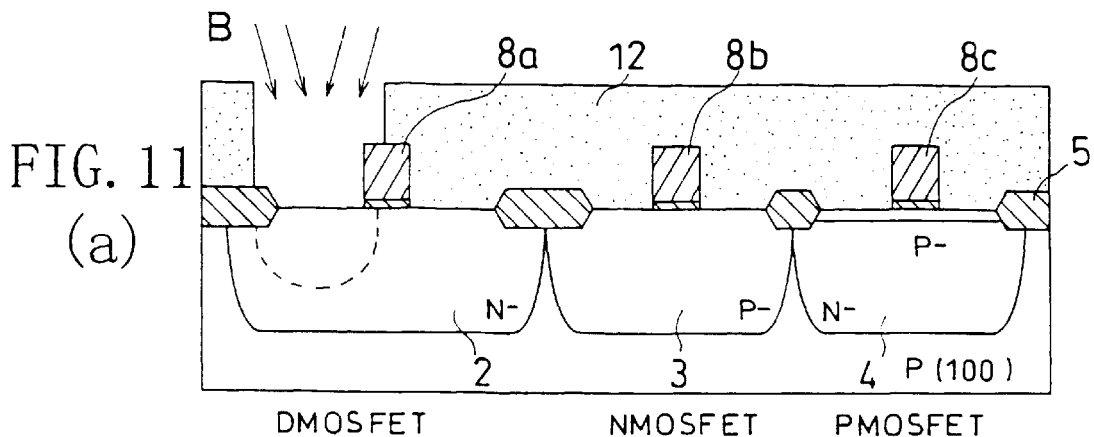
FIGS. 11(a) to 11(d) are cross-sectional views illustrating the second-half steps in a process of manufacturing a semiconductor device according to a seventh embodiment.
Figure 11:
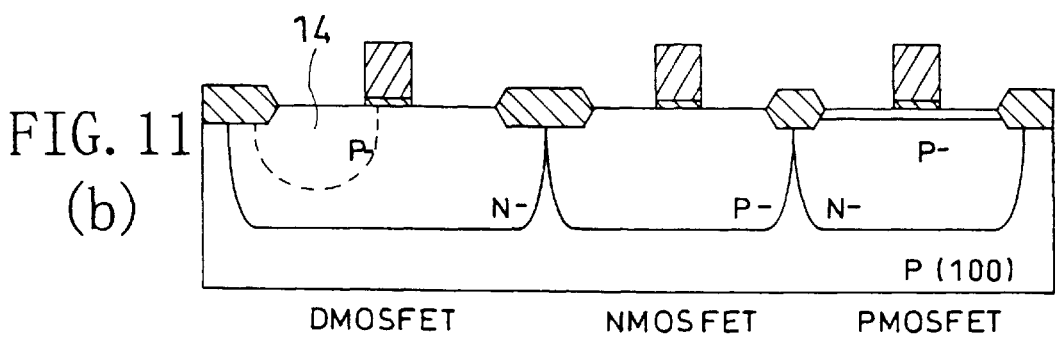
Figure 11:
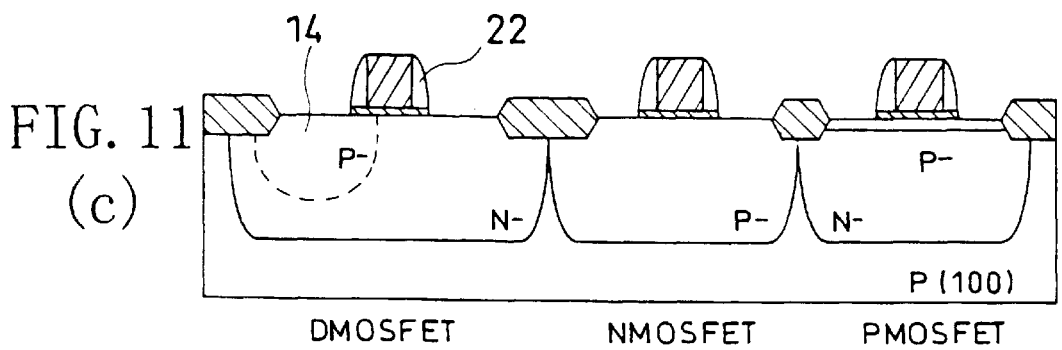
Figure 11:
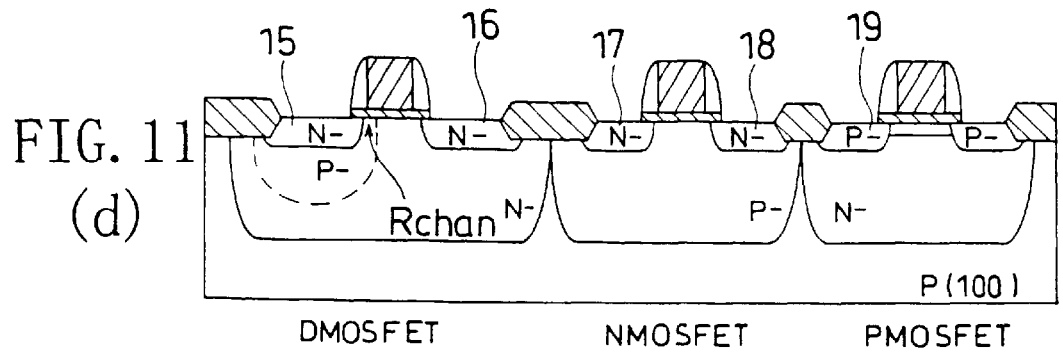

In the present embodiment, the same steps as illustrated by FIGS. 1(a) to 1(c) in the above first embodiment are performed prior to the step illustrated by FIG. 11(a). Specifically, an N⁻ drain diffused layer 2 as the first impurity diffused layer of a DMOSFET, a P⁻-well diffused layer 3 of an NMOSFET, and an N⁻-well diffused layer 4 of a PMOSFET are formed in a P-type semiconductor substrate 1, followed by the formation of an isolation 5 for defining respective regions in which the DMOSFET, NMOSFET, and PMOSFET are to be formed. Then, a P⁻ diffused layer 6 for Vt control is formed in the region in which the PMOSFET is to be formed. After gate oxide films 7 are formed on the surfaces of the respective regions of the P-type semiconductor substrate 1, there are formed an N⁺ gate electrode 8a of the DMOSFET, an N⁺ gate electrode 8b of the NMOSFET, and an N⁺ gate electrode 8c of the PMOSFET, each composed of a polysilicon film having a thickness of 300 nm. In the present embodiment, however, the gate electrodes 8a to 8c are smaller in width than in any of the above embodiments.

Next, as shown in FIG. 11(a), boron ions are implanted in two steps from two directions forming a plane angle of 180° therebetween into a region of the DMOSFET in which a body diffused layer is to be formed by using, as a mask, the resist film 12 with an opening corresponding to a region of the DMOSFET in which the source is to be formed and an n⁺ gate electrode 8a of the DMOSFET. In the first step, the boron ions are implanted at about 120 keV and $4\times10^{13}/cm^{-2}$ and at a tilt angle of about 10° from an axis perpendicular to a surface of the P-type semiconductor substrate 1 so that the boron ions are introduced only into a region underlying the edge on the source side of the N⁺ gate electrode 8a of the DMOSFET. In the second step, the semiconductor substrate 1 is rotated by 180° degrees before the boron ions are implanted at a tilt angle of 10° so that the boron ions are introduced into a portion of the region in which the DMOSFET is to be formed underlying the edge of the isolation 5.

Next, as shown in FIG. 11(b), the resist film 12 is removed and a heat treatment is performed at about 850° C. for about 30 minutes to form a P⁻ body diffused layer 14 as the second impurity diffused layer of the DMOSFET.

Next, as shown in FIG. 11(c), a silicon dioxide film is deposited to a thickness of about 200 nm over the entire surface of the silicon substrate by low-pressure CVD or like method, which is then etched back by anisotropic dry etching to form sidewalls 22 on both side faces of each of the gate electrodes 8a to 8c.

Next, as shown in FIG. 11(d), arsenic ions are implanted at about 40 keV and $4\times10^{15}/cm^{-2}$ into the respective regions in which the DMOSFET and NMOSFET are to be formed by using a resist film (not shown) and the sidewalls 22 as a mask. Then, BF₂ ions are implanted at about 40 keV and $3\times10^{15}/cm^{-2}$ into the region in which the PMOSFET is to be formed and a heat treatment is subsequently performed at about 850° C. for about 60 minutes to form an N⁺ source diffused layer 15, a channel region Rchan, and an N⁺ drain diffused layer 16 of the DMOSFET, an N⁺ source diffused layer 17 and an N⁺ drain diffused layer 18 of the NMOSFET, and a P⁺ source diffused layer 19 and a P⁺ drain diffused layer 20 of the PMOSFET.

Thereafter, an NSG film having a thickness of about 800 nm is formed as an interlayer insulating film by low-pressure CVD or like method, which is then dry etched by using a resist film as a mask to form contact holes, though the drawing thereof is omitted in the present embodiment. Finally, an Al film is formed as metal interconnections by sputtering, which is then etched by using a resist film as a mask to form Al interconnections, thereby finishing the semiconductor device.

In forming the P⁻ body diffused layer 14 and channel region Rchan of the DMOSFET in the present embodiment, the boron ions are implanted at a tilt angle of 10° much smaller than the tilt angle of 30° at which the boron ions are implanted in each of the above embodiments and at such a tilt angle that the boron ions are introduced into the N⁺ gate electrode 8a of the DMOSFET through the side face thereof which is closer to the source region and uncovered with the resist film 12, as shown in FIG. 11(a). Subsequently, a low-temperature heat treatment for activation is performed to form the P⁻ body diffused layer 14 and channel region Rchan of the DMOSFET. Thereafter, the sidewalls 22 are formed on the side faces of the N⁺ gate electrode 8a of the DMOSFET prior to the formation of the N⁺ source diffused layer 15 of the DMOSFET so that arsenic ions are implanted into a region displaced from the region into which the boron ions are implanted to form the P⁻ body diffused layer of the DMOSFET toward the source region, thereby forming the N⁺ source diffused layer 15.

The semiconductor device on which the DMOSFET, NMOSFET, and PMOSFET thus constructed are mounted achieves the following effects.

As described above, since the P⁻ body diffused layer 14 and channel region Rchan of the DMOSFET are formed by implanting the ions into the body diffused layer at a small tilt angle and then the N⁺ source diffused layer 15 is formed by forming the sidewalls 22 on the side faces of the N⁺ gate electrode 8a and using the sidewalls as a mask, the channel region Rchan sufficiently long can be formed easily between the N⁺ source diffused layer 15 and the N⁻ drain diffused layer 2 by introducing the impurity into the region underlying the gate electrode simply by ion implantation and low-temperature activation process. Hence, it will be understood that the threshold can be controlled easily without performing a high-temperature drive-in process which has previously been performed to extend the body diffused layer in the lateral direction and that the present embodiment can achieve the same effects as achieved by the first embodiment.

Moreover, since the boron ions are implanted at a small tilt angle (10°) in the step illustrated by FIG. 11(a) in the present embodiment, the depth of the P⁻ body diffused layer 14 of the DMOSFET becomes larger in the present embodiment than in the above first to fourth embodiment, resulting in a lower resistance of the p⁻ body diffused layer 14. Consequently, even when the surface concentration and threshold voltage of the DMOSFET are lowered to improve the performance of the DMOSFET, the resistance of the P⁻ body diffused layer can be reduced to a value lower than in the first embodiment. As a result, variations in threshold voltage resulting from an increase in potential at a body terminal induced by the substrate current of the DMOSFET are suppressed. In particular, even when an NPN bipolar transistor using the P⁻ body diffused layer 14 as the base, the N⁺ source diffused layer 15 as the emitter, and the N⁺ drain diffused layer 2 as the collector is produced, it presents a low resistance because of a high impurity concentration in the portion corresponding to the base, so that it becomes possible to suppress the activation of the parasitic bipolar transistor, resulting in an improved property of withstanding the voltage between the source and drain. In the case of forming the DMOSFET simultaneously with the NMOSFET and PMOSFET, sidewalls are typically provided on the gate electrodes of the NMOSFET and PMOSFET, so that the adoption of the manufacturing method of the present embodiment enables the formation of a semiconductor device having a DMOSFET with an excellent property of withstanding the voltage between the source and drain without increasing the number of process steps.

Variations of First to Seventh Embodiments

Although the source and drain contact diffused layers of the DMOSFET in each of the first to seventh embodiments are composed singly of the N⁺ source diffused layer 15 and N⁺ drain diffused layer 16, respectively, an LDD structure or a double structure of an N⁻ source diffused layer and an N⁺ source diffused layer or of an N⁻ drain diffused layer and an N⁺ drain diffused layer may be adopted instead.

Although sidewalls of insulating films are not formed on the side faces of any of the N⁺ gate electrode 8a of the DMOSFET, N⁺ gate electrode 8b of the NMOSFET, and N⁺ gate electrode 8c of the PMOSFET, the sidewalls may be formed instead. In this case, the sidewalls may be formed prior to or after ion implantation for forming the P⁻ body diffused layer 14.

The sidewalls may also be used as a mask in ion implantation for forming the source and drain contact diffused layers.

Although the N⁺ gate electrode 8a of the DMOSFET, the N⁺ gate electrode 8b of the NMOSFET, and the N⁺ gate electrode 8c of the PMOSFET are composed of single-layer films of polysilicon in the first to seventh embodiments, they may be composed of single-layer metal films, semiconductor films, or silicide films. Alternatively, a conductive film such as a metal film, semiconductor film, or silicide film or an insulating film such as a silicon dioxide film may be formed on the polysilicon film except in the fifth and sixth embodiments. The formation of such a protective film is particularly advantageous in that it enhances the function of inhibiting the penetration of impurity ions during ion implantation.

Although the gate electrode of the PMOSFET is of N⁺ type in the first to seventh embodiment, it may be of P⁺ type.

Although the low-concentration drain layer of the DMOSFET is composed of the N⁻ drain diffused layer 2, it may be composed of an N⁻ epitaxitially grown layer which may be formed prior to the formation of the isolation 5. Likewise, the P⁻ body diffused layer 30 may be composed of the P⁻ epitaxitially grown layer in the fourth embodiment.

Although a diffused layer for Vt control is not formed in the NMOSFET in the first to seventh embodiments, it may be formed prior to the formation of the gate oxide films.

Although the impurity ions are implanted in two steps in the first to seventh embodiments, they may be implanted in four steps by changing directions from which the impurity ions are implanted every 90° in one plane, since MISFETs having gate electrodes located orthogonally to each other are mostly mounted on the semiconductor device.

In the first, second, and third embodiments, the P⁻ body diffused layer 14 and P⁺ body buried diffused layer 32 composing the body diffused layer of the DMOSFET may be formed by ion implantation after the N+ source diffused layer 15 of the DMOSFET is formed.

Although the resist film 9 for forming gate electrodes is used as a part of the mask in ion implantation for forming the body diffused layer in the third embodiment, it may be composed of any film other than the resist film processed to have the same dimensions as the N+ gate electrode 8a of the DMOSFET. (On Profile of P− body diffused layer)

A description will now be given to the relationship between the angle at which impurity ions are implanted to form the P− body diffused layer 14 and the profile of the resulting P− body diffused layer 14 with reference to FIGS. 12(*a*) to 12(*c*) and FIGS. 13(*a*) and 13(*b*).

Figure 12:
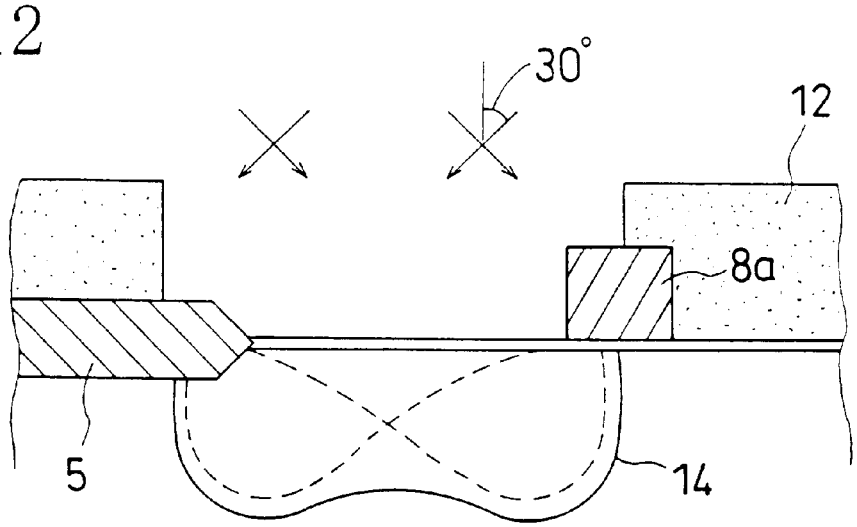
FIGS. 12(a) to 12(c) illustrate relationships between respective modes of impurity ion implantation in the step of forming a second impurity diffused layer in the process of manufacturing a semiconductor device according to the first embodiment and respective configurations of the formed second impurity diffused layers.
Figure 12:
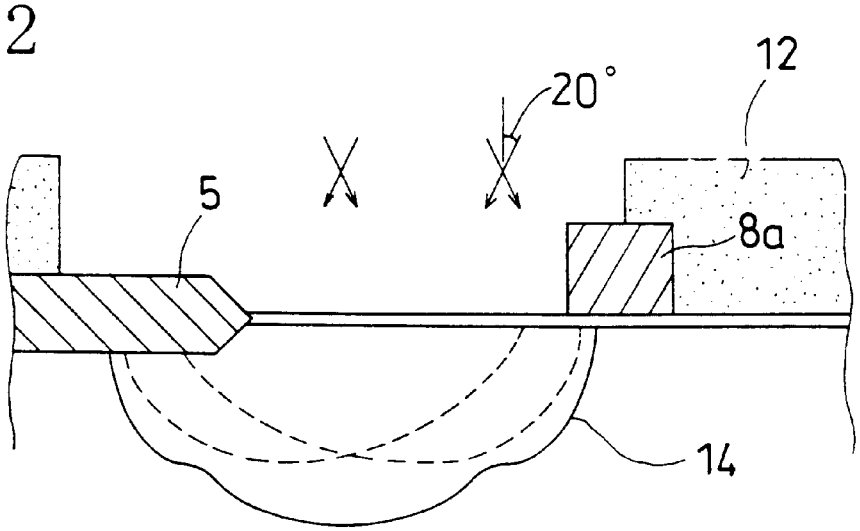
Figure 12:
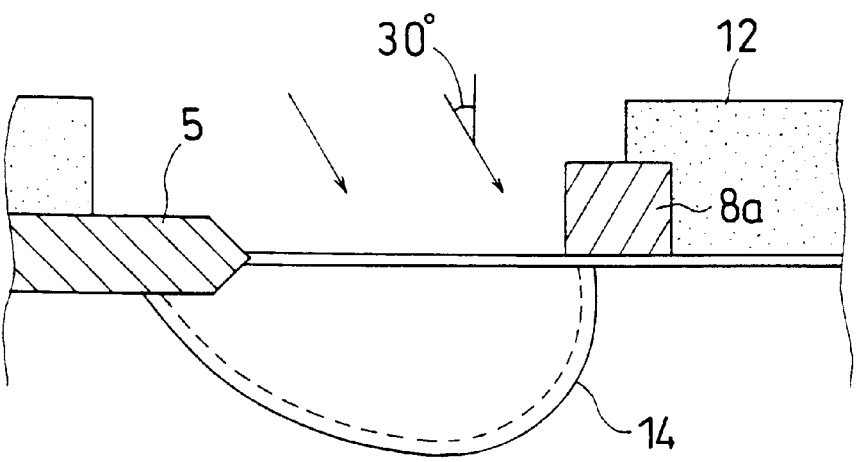

As shown in FIG. 12(*a*), when ion implantation is performed in two steps from directions largely tilted from an axis perpendicular to a surface of the semiconductor substrate by using, as a mask, a comparatively thick resist film 12 having an opening small in width, a P− body diffused layer 14 has such a profile that a base thereof is recessed in the vicinity of its center. In this case, impurity ions laterally penetrate deep into the semiconductor substrate particularly in the region underlying the N+ gate electrode 8a of the DMOSFET. Hence, the channel region is surely provided with a sufficiently large length even when a high-temperature drive-in diffusion process is not performed.

On the other hand, when ion implantation is performed in two steps at a moderately large tilt angle (about 20°) by using a comparatively thin resist film 12 having an opening large in width as shown in FIG. 12(*b*), the P− body diffused layer 14 has such a profile that a base thereof is projecting in the vicinity of its center. The method also enables impurity ions to laterally penetrate into the region underlying the N+ gate electrode 8a.

In the case of performing ion implantation from one direction tilted toward the isolation 5 in the region in which the source is to be formed as shown in FIG. 12(*c*), the P− body diffused layer 14 has such a downwardly projecting profile that the deepest portion thereof is offset toward the N+ gate electrode 8a. In this case also, the effects of the present invention can be achieved. However, it is necessary for the impurity ions in the P− body diffused layer 14 to reach a sufficiently deep portion in the lateral direction of the semiconductor substrate at the side of the isolation 5 in order to prevent contact between the N+ source diffused layer 15 and the N− drain diffused layer 2 in the first to third embodiments, i.e., electrical conduction between the N− drain diffused layer and the N+ source diffused layer.

Figure 13:
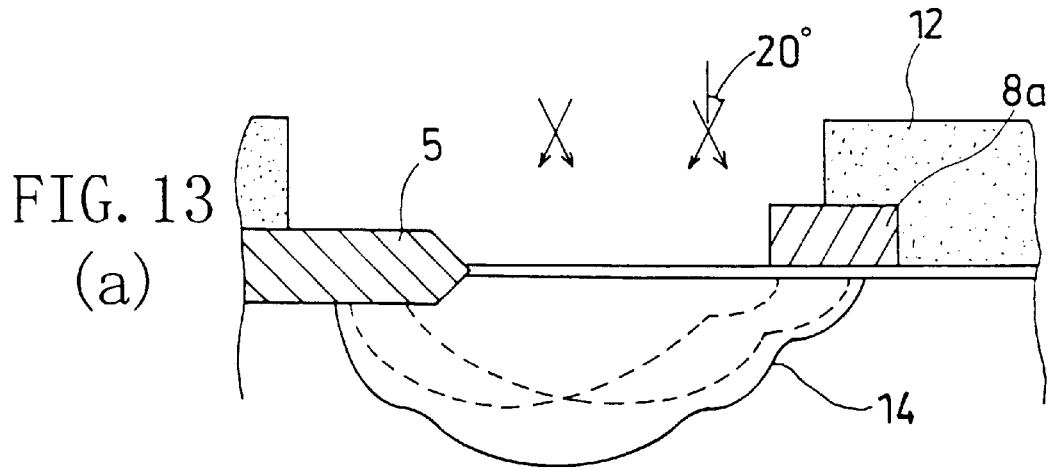
FIGS. 13(a) and 13(b) illustrate relationships between respective modes of impurity ion implantation in the step of forming a second impurity diffused layer in the process of manufacturing a semiconductor device according to each of the sixth and seventh embodiments and respective configurations of the formed second impurity diffused layers.
Figure 13:
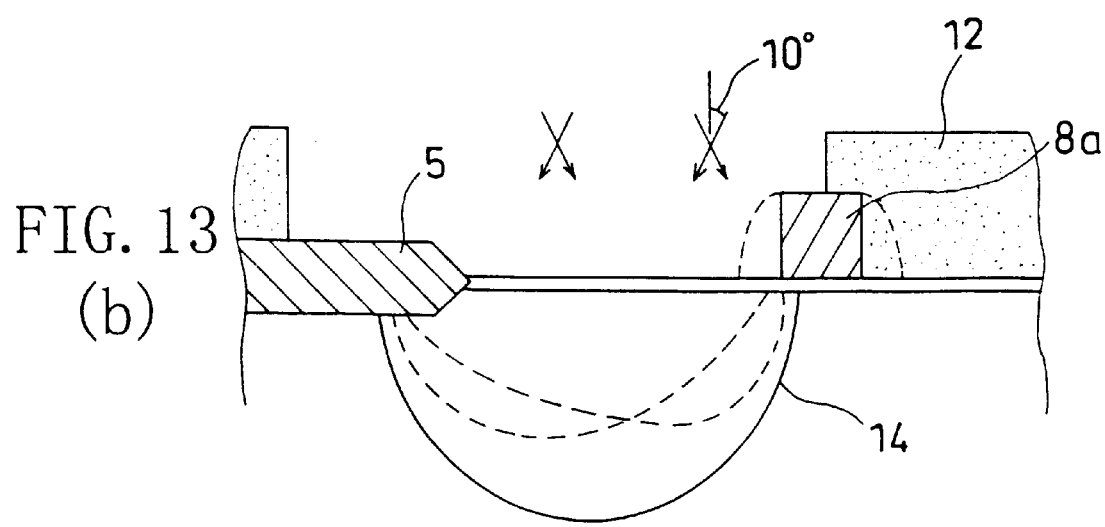

As shown in FIG. 13(*a*), in the case of reducing the thickness of the gate electrode 8a so as to implant the impurity ions through the portion of the gate electrode 8a uncovered with the resist film 12 (in this case, the tilt angle at which the ions are implanted is about 25°, which is different from the sixth and seventh embodiments), there can be obtained such a profile that the portion underlying the gate electrode (the portion forming a channel region) forms a junction shallower than the junction formed by the other portion of the P− body diffused layer 14. The edge of the portion forming a shallow junction of the P− body diffused layer 14 is determined by the resist film 12. By increasing the energy and does for implantation in such a method, the depth of the P− body diffused layer 14 and the impurity concentration in a deep portion of the substrate can be increased, while the impurity concentration in a near-surface region of the substrate forming the channel region is reduced. In other words, the threshold can be reduced while the activation of the parasitic transistor is suppressed.

In the case of performing ion implantation at a small tilt angle based on the premise that sidewalls are to be formed on both side faces of the gate electrode 8a in the subsequent step as shown in FIG. 13(*b*), the P− body diffused layer 14 presents a profile simply projecting downward toward the depths of the substrate. In this case, the lateral penetration of impurity ions below the gate electrode 8a is not so deep but the depth in the vertical direction of the P− body diffused layer 14 is increased, while the resistance of the P− body diffused layer 14 is reduced, which advantageously suppresses the activation of the parasitic bipolar transistor differentially. By forming the insulator sidewalls on both sides of the gate electrodes afterwards and performing ion implantation by using the insulator sidewalls and the gate electrode as a mask to form the source diffused layer, it becomes possible to provide a desired interval (roughly equal to the thickness of the silicon dioxide film for forming the sidewalls) between the edge of the source diffused layer and the edge of the P− body diffused layer 14, so that a channel region is provided with a sufficient length. Hence, the transistor having the profile exhibits excellent properties.

In the case of implanting impurity ions from a direction hardly tilted from an axis perpendicular to the surface of the semiconductor substrate (<10°) and subsequently performing a high-temperature drive-in process in accordance with a conventional method, the P− body diffused layer presents a downwardly projecting profile with substantially a flat base.

Since the impurity ions implanted as they are do not function as acceptors or donors, a heating process for activation is required. Although the impurity ions are diffused slightly by the heating process, the distance travelled by the diffused impurity ions is extremely small compared with the distance travelled by the diffused impurity ions in the conventional high-temperature drive-in process. According to the method of the present invention, it is sufficient to perform a heat treatment at a comparatively low temperature for a long period of time at about 850° C. for about 30 minutes or, alternatively, a heat treatment at a comparatively high temperature for an extremely short period of time, since the diffused impurity ions need not travel a long distance. By contrast, the conventional method requires a heat treatment at a high temperature for a long period of time at about 1000° C. for about 30 minutes, which is greatly different from the method of the present invention in terms of conditions.

Eighth Embodiment

Each of the following embodiments includes the process of manufacturing a MOSFET for high voltage which does not necessarily involve double diffusion, i.e., the process of manufacturing a MOSFET for high voltage other than a DMOSFET. However, each DMOSFET will be termed "DMOSFET" in the following description for the sake of convenience.

Figure 14:
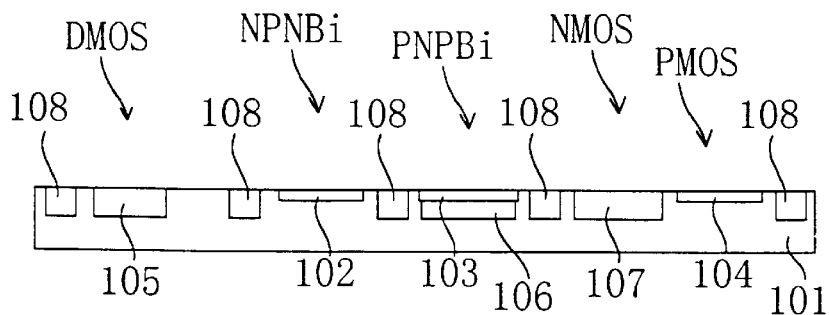
FIGS. 14(a) to 14(e) are cross-sectional views illustrating a process of manufacturing a semiconductor device according to an eighth embodiment.
Figure 14:
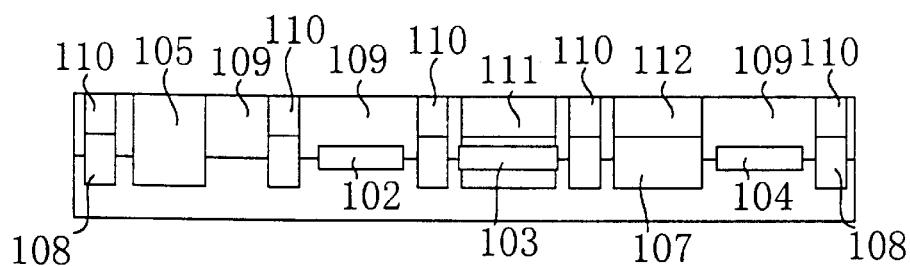
Figure 14:
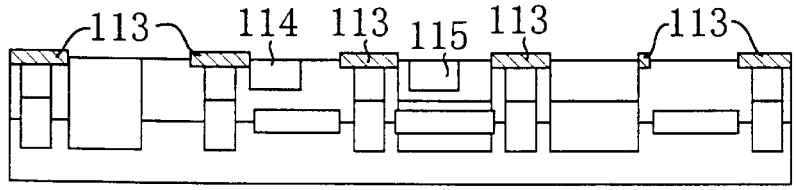
Figure 14:
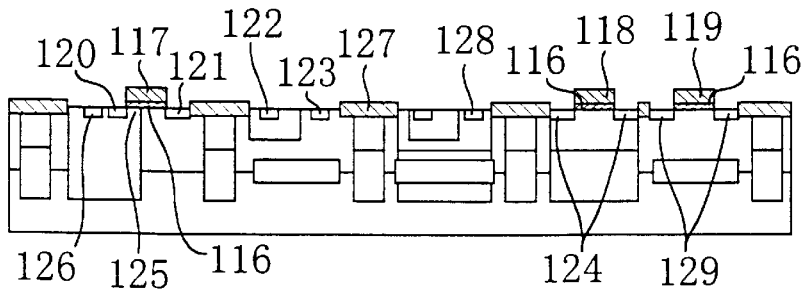
Figure 14:
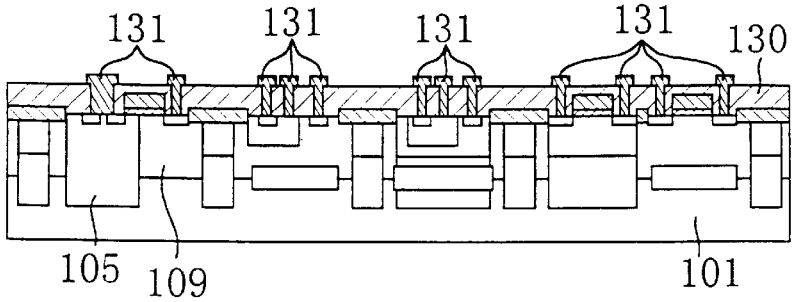

As shown in FIG. 14(*a*), ion implantation is performed by implanting arsenic ions into a P-type semiconductor substrate 101 with a resistivity of 10 to 20 Ω·cm at 40 keV and $5 \times 10^{14}/cm^2$. Then, a heat treatment is performed with respect to the semiconductor substrate 101 at a temperature of about 1100° C. for about 100 minutes, thereby forming a buried collector diffused layer 102 of an NPN bipolar transistor, a buried diffused layer 103 of a PNP bipolar transistor, and a buried diffused layer 104 of a PMOSFET. Subsequently, boron ions are implanted at about 40 keV and $8 \times 10^{13}/cm^2$ and a heat treatment is performed with respect to the semiconductor substrate 101 at a temperature of about 900° C. for about 30 minutes, thereby forming a body diffused layer 105 of a DMOSFET, a buried collector diffused layer 106 of the PNP bipolar transistor, a buried diffused layer 107 of an NMOSFET, and a buried isolation diffused layer 108 for isolation.

Next, as shown in FIG. 14(b), there is formed an N-type epitaxial layer 109 having a resistivity of 1 Ω·cm and a thickness of about 1.2 µm. Then, boron ions are implanted at about 150 keV and $2 \times 10^{12}/cm^2$ and a heat treatment is subsequently performed with respect to the semiconductor substrate 101 at about 1100° C. for about 100 minutes, thereby forming a well diffused layer 110 for isolation, a collector diffused layer 111 of the PNP bipolar transistor, and a body diffused layer 112 of the NMOSFET. Since the impurity is diffused by the heat treatment, the buried body diffused layer 105 of the DMOSFET, the buried collector diffused layer 106 of the PNP bipolar transistor, the buried diffused layer 107 of the NMOSFET, and the buried isolation diffused layer 108 for isolation extend upwardly to reach a surface of the substrate. On the other hand, there are at least partially overlapping portions between the well diffused layer 110 and the buried isolation diffused layer 108, between the buried diffused layer 107 and body diffused layer 112 of the NMOSFET, and between the buried collector diffused layer 106 and collector diffused layer 111 of the PNP bipolar transistor.

Next, as shown in FIG. 14(c), a thermal oxide film 113 having a thickness of about 350 nm is formed on the N-type epitaxial layer 109 by selective oxidation or like method. Then, boron ions are implanted at about 30 keV and $1.2 \times 10^{13}/cm^2$ to form an intrinsic base diffused layer 114 of the NPN bipolar transistor. Subsequently, phosphorus ions are implanted at about 150 keV and $1.22 \times 10^{13}/cm^2$ to form an intrinsic base diffused layer 115 of the PNP bipolar transistor.

Next, as shown in FIG. 14(d), the substrate surface is covered with gate oxide films 116 having a thickness of about 15 nm, followed by the deposition of a polysilicon film having a thickness of about 0.4 µm thereon, which is then patterned to form an N-type gate electrode 117 of the DMOSFET, an N-type gate electrode 118 of the NMOSFET, and an N-type gate electrode 119 of the PMOSFET. Subsequently, arsenic ions are implanted at 40 keV and $1 \times 10^{16}/cm^2$ to form a source diffused layer 120 and a drain contact diffused layer 121 of the DMOSFET, an emitter diffused layer 122 and a collector contact diffused layer 123 of the NPN bipolar transistor, and source/drain diffused layers 124 of the NMOSFET. In the DMOSFET, a region of the buried body diffused layer 105 underlying the N-type gate electrode 117 and interposed between the source diffused layer 120 and the N-type epitaxial layer 109 forms a channel region 125. The length of the channel region 125 is determined by a difference in lateral diffusion length between the buried body diffused layer 105 and the source diffused layer 120. Thereafter, ions of boron fluoride are implanted at 40 keV and $3 \times 10^{15}/cm^2$ to form a body contact diffused layer 126 of the DMOSFET and an emitter diffused layer 127 and a collector contact diffused layer 128 of the PNP bipolar transistor, and source/drain diffused layers 129 of the PMOSFET.

Next, as shown in FIG. 14(e), a protective film 13 having a thickness of about 0.7 µm is formed, followed by the formation of metal electrodes 131 on the respective elements, thereby finishing the semiconductor device.

According to the present embodiment, since the buried body diffused layer 105 extends in the epitaxial layer 109 to reach the substrate surface in the DMOSFET isolated from the bipolar transistor by the PN junction isolation (buried isolation diffused layer 108), the impurity concentration is lower in a portion closer to the substrate surface. Accordingly, the impurity concentration of the channel region 125 formed near the substrate surface is reduced and the threshold, i.e., on-resistance of the DMOSFET can be reduced. On the other hand, the impurity concentration of the buried body diffused layer 105 inside the substrate is higher than that of the channel region 125, so that the base resistance of the parasitic bipolar transistor is lowered. Hence, the on-resistance of the DMOSFET can be reduced at the same time as the activation of the parasitic bipolar transistor is suppressed.

Moreover, since the present embodiment does not require an extra step added to the BiCMOS process in order to form the DMOSFET, the DMOSFET can be formed without affecting the properties of the bipolar transistor and MOSFET and without increasing the cost of manufacturing the semiconductor device.

Ninth Embodiment

Figure 15:
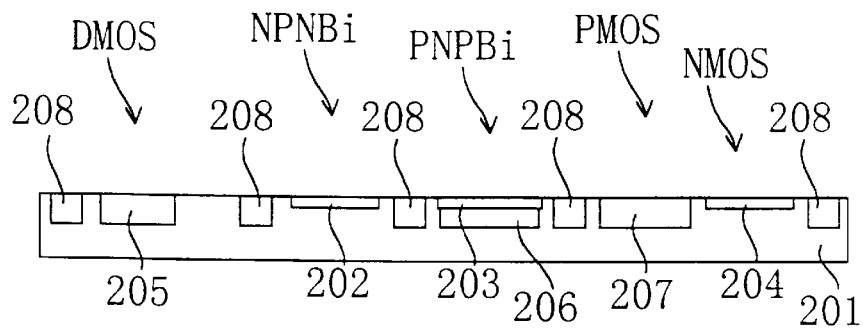
FIGS. 15(a) to 15(e) are cross-sectional views illustrating a process of manufacturing a semiconductor device according to a ninth embodiment.
Figure 15:
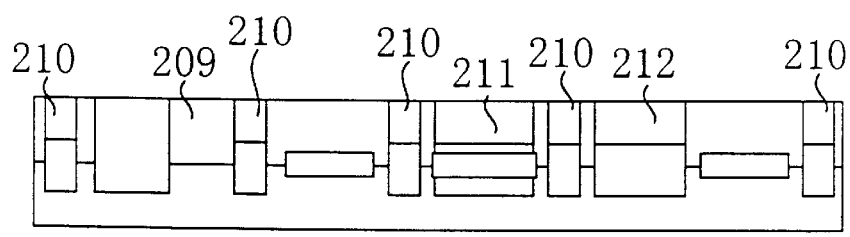
Figure 15:
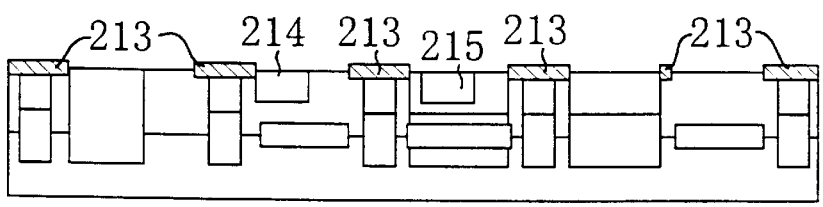
Figure 15:
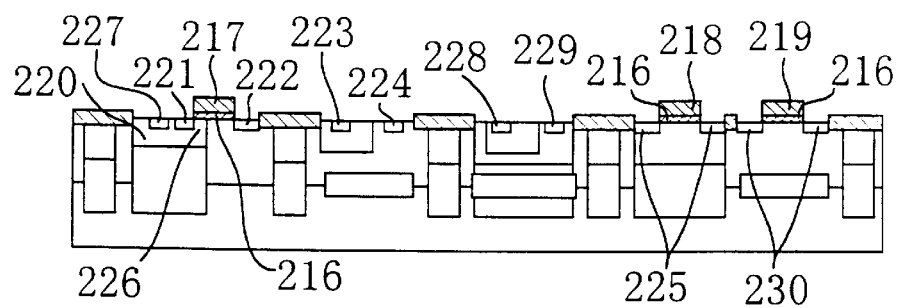
Figure 15:
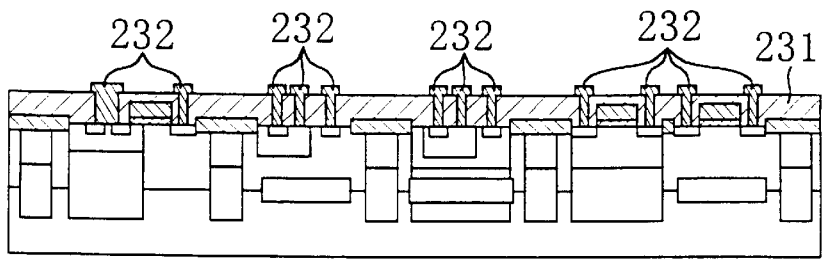

As shown in FIG. 15(a), arsenic ions are implanted at 40 keV and $5 \times 10^{14}/cm^2$ into a P-type semiconductor substrate 201 having a resistivity of 10 to 20 Ω·cm. Subsequently, a heat treatment is performed with respect to the semiconductor substrate 201 at a temperature of 1100° C. for about 100 minutes to form a buried collector diffused layer 202 of an NPN bipolar transistor, a buried diffused layer 203 of a PNP bipolar transistor, and a buried diffused layer 204 of a PMOSFET. Then, boron ions are implanted at 40 keV and $8 \times 10^{13}/cm^2$ and a heat treatment is subsequently performed with respect to the semiconductor substrate 201 at a temperature of 900° C. for about 30 minutes to form a buried body diffused layer 205 of the DMOSFET, a buried collector diffused layer 206 of the PNP bipolar transistor, a buried diffused layer 207 of the NMOSFET, and a buried isolation diffused layer 208 for isolation.

Next, as shown in FIG. 15(b), there is an N-type epitaxial layer 209 having a resistivity of 1 Ω·cm and a thickness of about 2.5 µm. Then, boron ions are implanted at 150 keV and $2 \times 10^{12}/cm^2$ and a heat treatment is subsequently performed at a temperature of about 1100° C. for about 100 minutes to form a well diffused layer 210 for isolation, a collector diffused layer 211 of the PNP bipolar transistor, and a body diffused layer 212 of the NMOSFET. On the other hand, there are at least partially overlapping portions between the well diffused layer 210 and the buried isolation diffused layer 208, between the buried diffused layer 207 and body diffused layer 212 of the NMOSFET, and between the buried collector diffused layer 206 and collector diffused layer 211 of the PNP bipolar transistor.

Next, as shown in FIG. 15(c), a thermal oxide film 213 having a thickness of about 350 nm is formed on the N-type epitaxial layer 209 by selective oxidation or like method. Then, boron ions are implanted at 30 keV and $1.2 \times 10^{13}/cm^2$ to form an intrinsic base diffused layer 214 of the NPN bipolar transistor. Subsequently, phosphorus ions are implanted at 150 keV and $1.22 \times 10^{13}/cm^2$ to form an intrinsic base diffused layer 215 of the PNP bipolar transistor.

Next, as shown in FIG. 15(d), the substrate surface is covered with gate oxide films 216 having a thickness of about 15 nm, followed by the deposition of a polysilicon film having a thickness of about 0.4 µm thereon, which is then patterned to form an N-type gate electrode 127 of the DMOSFET, an N-type gate electrode 218 of the NMOSFET, and an N-type gate electrode 219 of the PMOSFET. Then, boron ions are implanted at 140 keV and $3\times10^{14}/cm^2$ to form a body diffused layer 220 of the DMOSFET. The body diffused layer 220 has at least a partially overlapping portion with the buried body diffused layer 205. Subsequently, arsenic ions are implanted at 40 keV and $1\times10^{16}/cm^2$ to form a source diffused layer 221 and a drain contact diffused layer 222 of the DMOSFET, an emitter diffused layer 223 and a collector contact diffused layer 224 of the NPN bipolar transistor, and source/drain diffused layers 225 of the NMOSFET. In the DMOSFET, a region of the body diffused layer 220 underlying the N-type gate electrode 217 and interposed between the source diffused layer 222 and the N-type epitaxial layer 209 forms a channel region 226. The length of the channel region 226 is determined by a difference in lateral diffusion length between the body diffused layer 220 and the source diffused layer 221. Thereafter, ions of boron fluoride are implanted at 40 keV and $3\times10^{15}/cm^2$ to form a body contact diffused layer 227 for the DMOSFET, an emitter diffused layer 228 and a collector contact diffused layer 229 of the PNP bipolar transistor, and source/drain diffused layers 230 of the PMOSFET.

Next, as shown in FIG. 15(e), a protective film 231 having a thickness of about 0.7 μm is formed, followed by the formation of metal electrodes 232 on the respective elements, thereby finishing the semiconductor device.

According to the present embodiment, the buried body diffused layer 205 is at least partially overlapping the body diffused layer 220 to form the body region in the DMOSFET isolated by the PN junction isolation. The impurity concentration in a region near the substrate surface is predominantly determined by the impurity concentration in the body diffused layer 220. On the other hand, the impurity concentration of the body region inside the substrate becomes equal to the impurity concentration of the buried body diffused layer 205 or the sum of the impurity concentration of the buried body diffused layer 205 and the impurity concentration of the body diffused layer 220. Since the impurity concentration of the buried body diffused layer 205 is higer than the impurity concentration of the body diffused layer 220 in the present embodiment, the base resistance of the parasitic bipolar transistor is reduced. Hence, the on-resistance of the DMOSFET can be reduced at the same time as the activation of the parasitic bipolar transistor is suppressed.

Moreover, in contrast to the conventional process of forming BiCMOS and DMOSFET, the present embodiment does not require an extra step added to the process of forming BiCMOS and DMOSFET since the buried body diffused layer 205 of the DMOSFET is formed simultaneously with the formation of the buried diffused layers 206 to 208 of the same conductivity type as that of the semiconductor substrate 201 in the BiCMOS process. Hence, the on-resistance of the DMOSFET can be reduced at the same time as the activation of the parasitic bipolar transistor is suppressed without affecting the properties of the bipolar transistor and MOSFET and without increasing the cost of manufacturing the semiconductor device.

Tenth Embodiment

Figure 16:
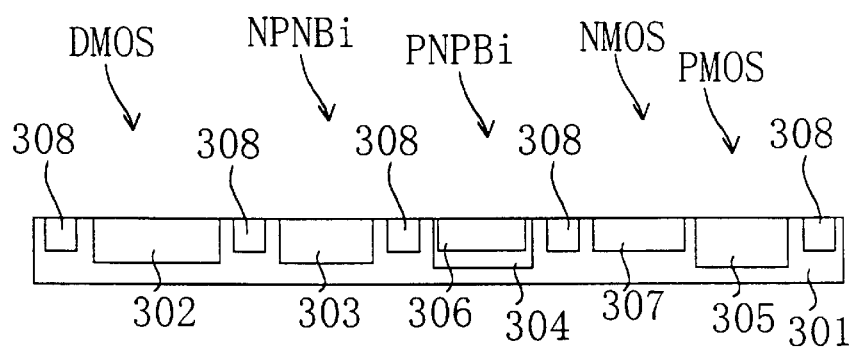
FIGS. 16(a) to 16(e) are cross-sectional views illustrating a process of manufacturing a semiconductor device according to a tenth embodiment.
Figure 16:
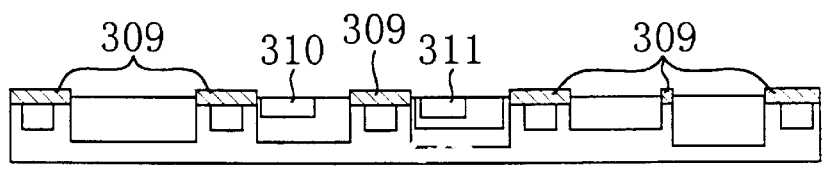
Figure 16:
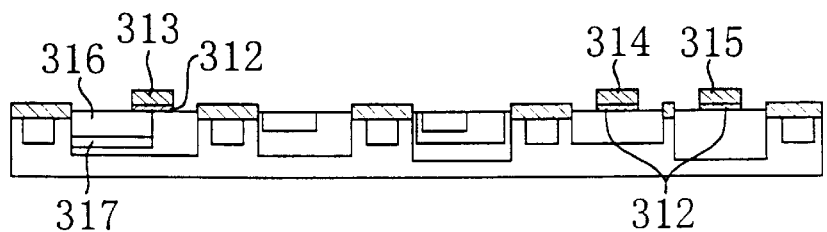
Figure 16:
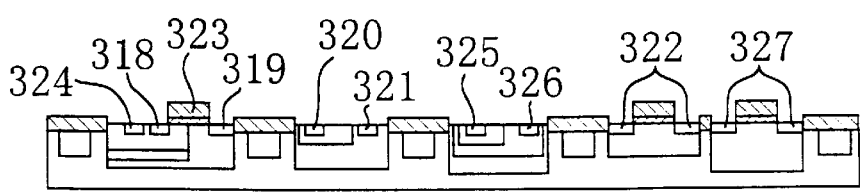
Figure 16:
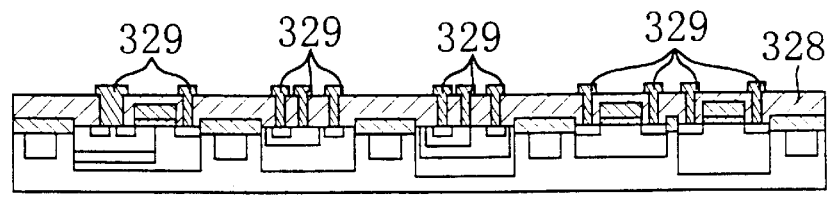

As shown in FIG. 16(a), phosphorus ions are implanted at 180 keV and $2\times10^{11}/cm^2$ and subsequently boron ions are implanted at 150 keV and $2\times10^{12}/cm^2$ into a P-type semiconductor substrate 301 having a resistivity of 10 to 20 Ω·m. Thereafter, a heat treatment is performed at a temperature of about 1100° C. for about 100 minutes to form a drain diffused layer 32 of a DMOSFET, a collector diffused layer 303 of an NPN bipolar transistor, an isolation diffused layer 304 of a PNP bipolar transistor, a body diffused layer 305 of a PMOSFET, a collector diffused layer 306 of the PNP bipolar transistor, a body diffused layer 307 of an NMOSFET, and a well diffused layer 308 for isolation.

Next, as shown in FIG. 16(b), a thermal oxide film 309 having a thickness of about 350 nm is formed on the semiconductor substrate 301 by selective oxidation or like method. Then, boron ions are implanted at 30 keV and $1.2\times10^{13}/cm^2$ to form an intrinsic base diffused layer 310 of the NPN bipolar transistor. Subsequently, phosphorus ions are implanted at 150 keV and $1.22\times10^{13}/cm^2$ to form an intrinsic base diffused layer 311 of the PNP bipolar transistor.

Next, as shown in FIG. 16(c), the substrate surface is covered with gate oxide films 312 having a thickness of about 15 nm, followed by the deposition of a polysilicon film having a thickness of about 0.4 μm thereon, which is then patterned to form an N-type gate electrode 313 of the DMOSFET, an N-type gate electrode 314 of the NMOSFET, and an N-type gate electrode 315 of the PMOSFET. Then, boron ions are implanted at 140 keV and $3\times10^{14}$ cm$^2$ to form a body diffused layer 316 of the DMOSFET. Subsequently, boron ions are implanted again at 500 keV and $5\times10^{14}/cm^2$ to form a buried body diffused layer 317 of the DMOSFET. The body diffused layer 316 has at least a partially overlapping portion with the buried body diffused layer 317.

Next, as shown in FIG. 16(d), arsenic ions are implanted at 40 keV and $1\times10^{16}/cm^2$ to form a source diffused layer 318 and a drain contact diffused layer 319 of the DMOSFET, an emitter diffused layer 320 and a collector contact diffused layer 321 of the NPN bipolar transistor, and source/drain diffused layers 322 of the NMOSFET. In the DMOSFET, a region of the body diffused layer 316 underlying the N-type gate electrode 313 and interposed between the source diffused layer 318 and the drain diffused layer 302 forms a channel region 323. The length of the channel region 323 is determined by a difference in lateral diffusion length between the body diffused layer 316 and the source diffused layer 318. Then, ions of boron fluoride are implanted at 40 keV and $3\times10^{15}/cm^2$ to form a body contact diffused layer 324 of the DMOSFET, an emitter diffused layer 325 and a collector contact diffused layer 326 of the PNP bipolar transistor, and source/drain diffused layers 327 of the PMOSFET.

Next, as shown in FIG. 16(e), a protective film 328 having a thickness of about 0.7 μm is formed, followed by the formation of metal electrodes 329 on the respective elements, thereby finishing the semiconductor device.

According to the present embodiment, the buried body diffused layer 317 partially overlaps the body diffused layer 316 to form the body layer in the DMOSFET isolated by the PN junction isolation. The impurity concentration of the channel region 322 near the substrate surface is predominantly determined by the impurity concentration of the body diffused layer 316. On the other hand, the impurity concentration of the body region inside the substrate becomes equal to the impurity concentration of the buried body diffused layer 31 or the sum of the impurity concentration of the buried body diffused layer 317 and the impurity concentration of the body diffused layer 316. Since the impurity concentration of the body diffused layer 316 is lower than the impurity concentration of the buried body diffused layer 317 in the present embodiment, the base resistance of the parasitic bipolar transistor is reduced. Hence, the on-resistance of the DMOSFET can be reduced at the same time as the activation of the bipolar transistor is suppressed.

In addition, the present embodiment does not require the formation of an epitaxial layer which has conventionally been required to reduce the on-resistance of the DMOSFET or to provide isolation in the case of forming the DMOSFET in the BiCMOS process. The epitaxial layer is unnecessary in the present embodiment since the on-resistance can be reduced by the buried body diffused layer 317 formed in the DMOSFET and the isolation has been formed. Consequently, the cost of manufacturing the semiconductor device is not increased, while the properties of the bipolar transistor and MOSFET are not affected.

Although the body diffused layer 317 is formed after the body diffused layer 316 is formed in the present embodiment, the step of forming the buried body diffused layer 317 can be performed at any stage.

Eleventh Embodiment

Figure 17:
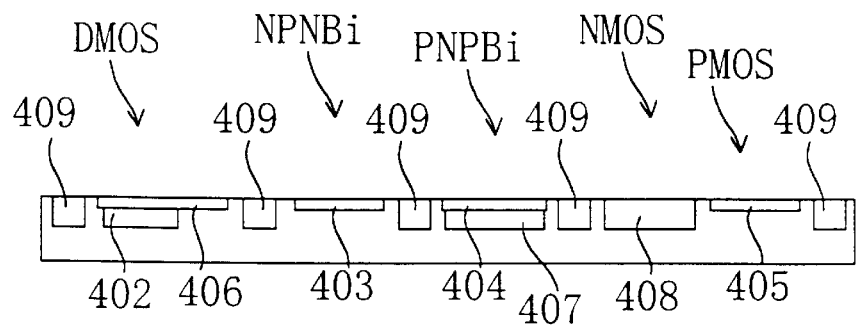
FIGS. 17(a) to 17(e) are cross-sectional views illustrating a process of manufacturing a semiconductor device according to an eleventh embodiment.
Figure 17:
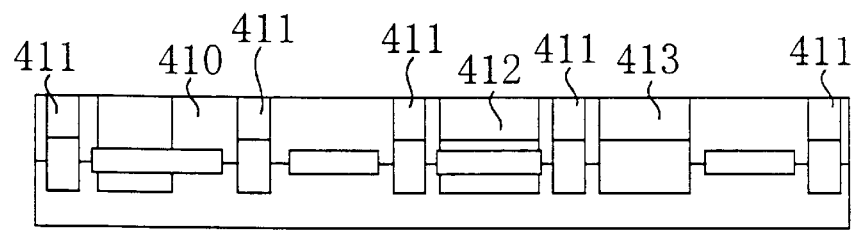
Figure 17:
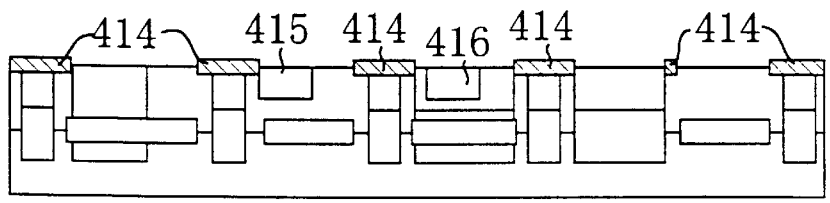
Figure 17:
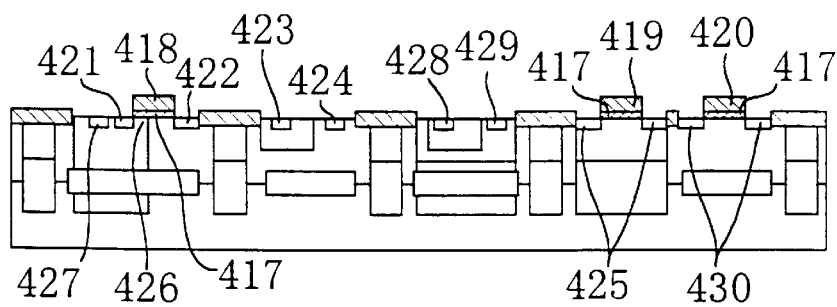
Figure 17:
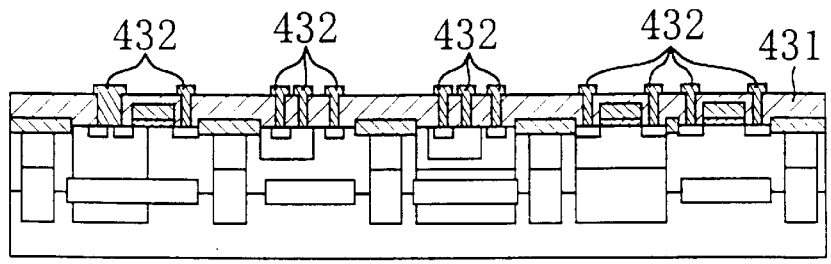

As shown in FIG. 17(a), arsenic ions are implanted at 40 keV and $5 \times 10^{14}/cm^2$ into a P-type semiconductor substrate 401 having a resistivity of 10 to 20 Ω·cm. Thereafter, a heat treatment is performed with respect to the semiconductor substrate 401 at a temperature of about 1100° C. for about 100 minutes, thereby forming a drain diffused layer 402 of a DMOSFET, a buried collector diffused layer 403 of an NPN bipolar transistor, a buried diffused layer 404 of a PNP bipolar transistor, and a buried diffused layer 405 of a PMOSFET. Then, boron ions are implanted at 40 keV and $8 \times 10^{13}/cm^2$ and a heat treatment is subsequently performed with respect to the semiconductor substrate 401 at a temperature of about 900° C. for about 30 minutes, thereby forming a buried body diffused layer 406 of the DMOSFET, a collector diffused layer 407 of the PNP bipolar transistor, a buried diffused layer 408 of the NMOSFET, and a buried isolation diffused layer 409 for isolation.

Next, as shown in FIG. 17(b), an N-type epitaxial layer 410 having a resistivity of 1 Ω·cm and a thickness of 1.2 μm is formed. Then, boron ions are implanted at 150 keV and $2 \times 10^{12}/cm^2$ and a heat treatment is subsequently performed with respect to the semiconductor substrate 401 at a temperature of about 1100° C. for about 100 minutes, thereby forming a well diffused layer 411 for isolation, a collector diffused layer 412 of the PNP bipolar transistor, and a body diffused layer 413 of the NMOSFET. Since the impurity is diffused by the heat treatment, the buried body diffused layer 406 of the DMOSFET, the buried collector diffused layer 407 of the PNP bipolar transistor, the buried diffused layer 408 of the NMOSFET, and the buried isolation diffused layer 409 for isolation extend upwardly to reach the substrate surface. There are at least partially overlapping portions between the well diffused layer 411 and the buried isolation diffused layer 409, between the buried diffused layer 408 and body diffused layer 413 of the NMOSFET, and between the buried collector diffused layer 407 and collector diffused layer 412 of the PNP bipolar transistor. Since the diffusion rate of boron is higher than that of arsenic, a part of the buried body diffused layer 406 extends to overlie the drain diffused layer 402 as a result of the heat treatment. On the other hand, the buried body diffused layer 406 is lower in impurity concentration than the buried drain diffused layer 402. As a result, the buried body diffused layer 406 is divided into upper and lower parts by the buried drain diffused layer 402.

Next, as shown in FIG. 17(c), a thermal oxide film 414 having a thickness of about 350 nm is formed on the N-type epitaxial layer 410 by selective oxidation or like method. Then, boron ions are implanted at 30 keV and $1.2 \times 10^{13}/cm^2$ to form an intrinsic base diffused layer 415 of the NPN bipolar transistor. Subsequently, phosphorus ions are implanted at 150 keV and $1.22 \times 10^{13}/cm^2$ to form an intrinsic base diffused layer 416 of the PNP bipolar transistor.

Next, as shown in FIG. 17(d), the substrate surface is covered with gate oxide films 417 having a thickness of about 15 nm, followed by the deposition of a polysilicon film having a thickness of about 0.4 μm thereon, which is then patterned to form an N-type gate electrode 418 of the DMOSFET, an N-type gate electrode 419 of the NMOSFET, and an N-type gate electrode 420 of the PMOSFET. Subsequently, arsenic ions are implanted at 40 keV and $1 \times 10^{16}/cm^2$ to form a source diffused layer 421 and a drain contact diffused layer 422 of the DMOSFET, an emitter diffused layer 423 and a collector contact diffused layer 424 of the NPN bipolar transistor, and source/drain diffused layers 425 of the NMOSFET. In the DMOSFET, a region of the buried body diffused layer 406 underlying the N-type gate electrode 418 and interposed between the source diffused layer 421 and the N-type epitaxial layer 410 forms a channel region 426. The length of the channel region 426 is determined by a difference in lateral diffusion length between the buried body diffused layer 406 and the source diffused layer 421. Then, ions of boron fluoride are implanted at 40 keV and $3 \times 10^{15}/cm^2$ to form a body contact diffused layer 427 of the DMOSFET, an emitter diffused layer 428 and a collector contact diffused layer 429 of the PNP bipolar transistor, and source/drain diffused layers 430 of the PMOSFET.

Next, as shown in FIG. 17(e), a protective film 431 having a thickness of about 0.7 μm is formed, followed by the formation of metal electrodes on the respective elements, thereby finishing the semiconductor device.

According to the present embodiment, in the DMOSFET isolated by the PN junction isolation, the buried body diffused layer 406 extends upwardly in the epitaxial layer 410 as the diffusion of the impurity proceeds to reach the substrate surface, so that the impurity concentration is lower in a portion closer to the substrate surface. Accordingly, the impurity concentration of the channel region 426 formed near the substrate surface is reduced and the on-resistance can be reduced. On the other hand, the impurity concentration of the buried body diffused layer 406 inside the substrate is higher than that of the channel region 426, so that the base resistance of the parasitic bipolar transistor is lowered. Hence, the on-resistance of the DMOSFET can be reduced at the same time as the activation of the parasitic bipolar transistor is suppressed.

In addition, since the present embodiment does not require an extra step added to the BiCMOS process to form the DMOSFET, the DMOSFET can be formed without affecting the properties of the bipolar transistor and MOSFET and without increasing the cost of manufacturing the semiconductor device.

In the present embodiment, the buried drain diffused layer 402 of the same conductivity type as the semiconductor substrate 401 has resistance lower than that of the semiconductor substrate 401, since the impurity concentration of the buried drain diffused layer 402 is higher than that of the semiconductor substrate 401. Accordingly, the drain current passing through the channel region 426 flows through the buried drain diffused layer 402 having lower resistance rather than the semiconductor substrate 401 having higher resistance, so that the resulting DMOSFET has lower on-resistance.

Furthermore, a Zener diode is formed between the buried body diffused layer 406 and the buried drain diffused layer 402 in the present embodiment. Since a high-voltage surge from a load or the like is absorbed by the Zener diode, a high-surge-withstand property is obtained.

Twelfth Embodiment

Figure 18:
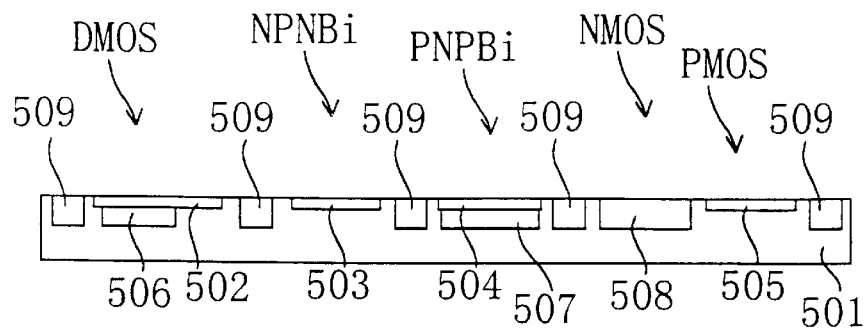
FIGS. 18(a) to 18(e) are cross-sectional views illustrating a process of manufacturing a semiconductor device according to a twelfth embodiment.
Figure 18:
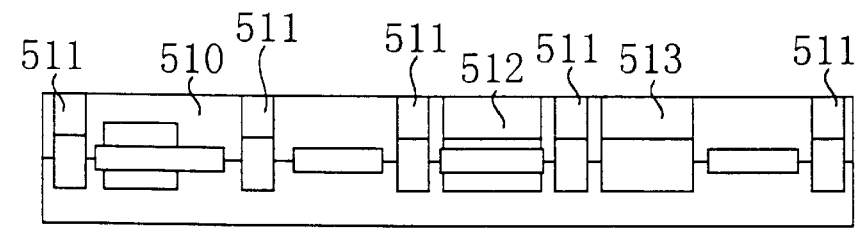
Figure 18:
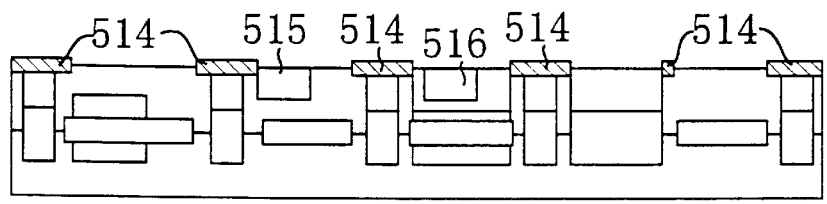
Figure 18:
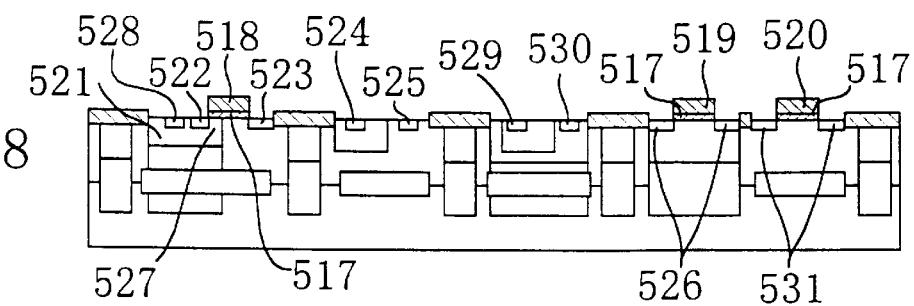
Figure 18:
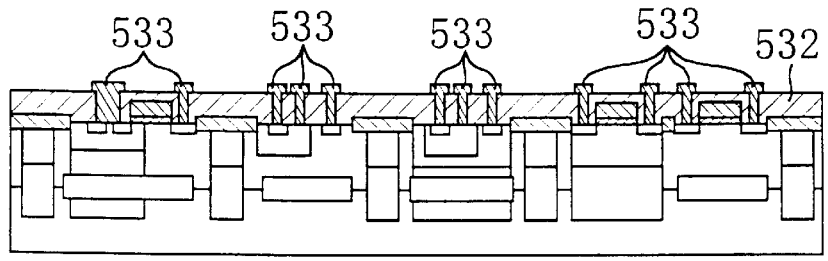
Figure 20A:
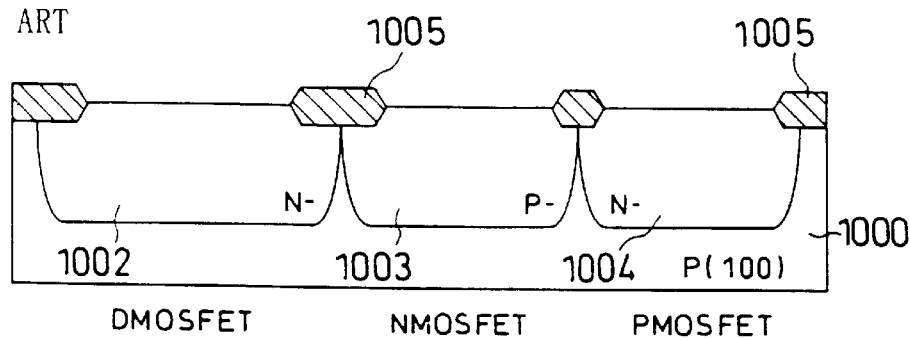
FIGS. 20(a) and 20(b) are cross-sectional views illustrating the first-half steps in a conventional process of manufacturing a device on which a MOSFET and a CMOSFET are compositely mounted.
Figure 20B:
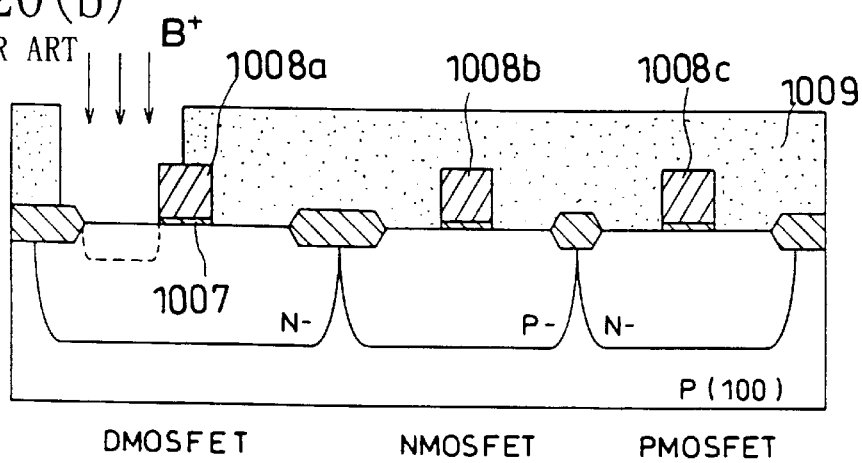
Figure 21A:
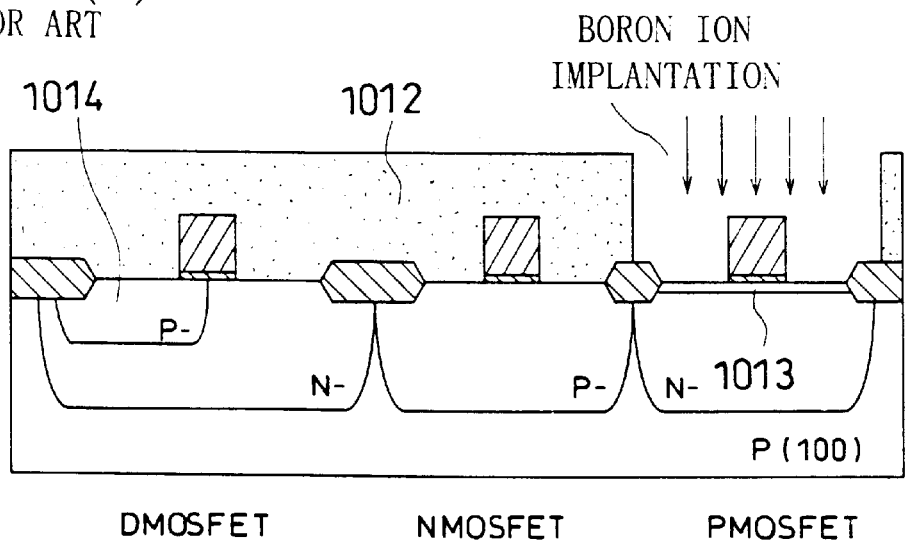
FIGS. 21(a) and 21(b) are cross-sectional views illustrating the second-half steps in the conventional process of manufacturing the device on which the MOSFET and CMOSFET are compositely mounted.
Figure 21B:
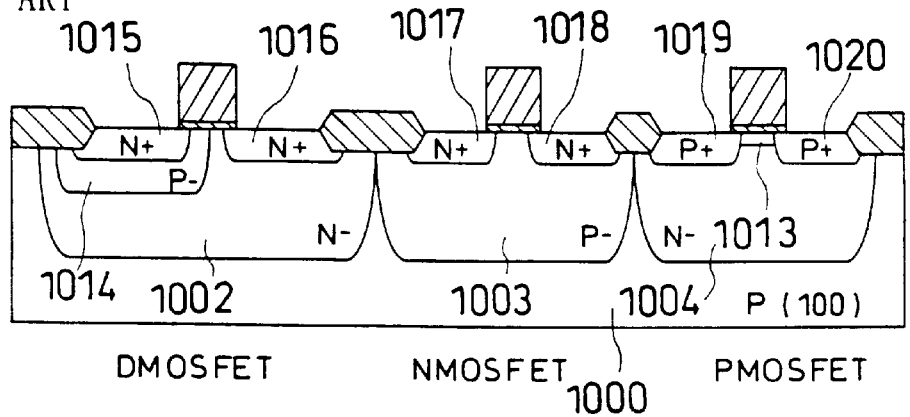
Figure 22A:
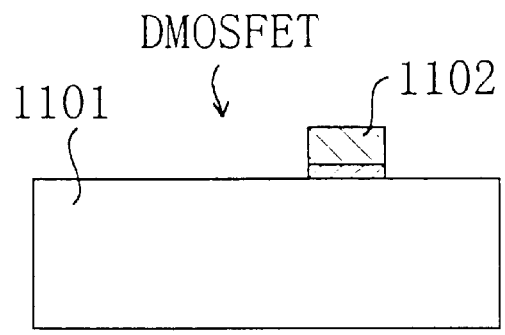
FIGS. 22(a) to 22(d) are cross-sectional views illustrating a conventional process of manufacturing a DMOSFET.
Figure 22B:
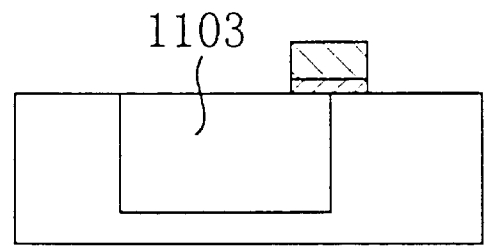
Figure 22C:
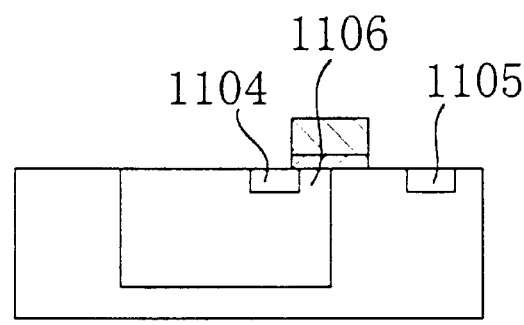
Figure 22D:
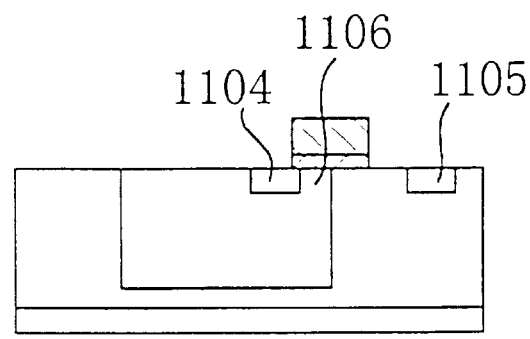

As shown in FIG. 18(a), arsenic ions are implanted at 40 keV and $5 \times 10^{14}/cm^2$ into a P-type semiconductor substrate 501 having a resistivity of 10 to 20 Ω·cm. Thereafter, a heat treatment is performed with respect to the semiconductor substrate 501 at a temperature of about 1100° C. for about 100 minutes, thereby forming a buried drain diffused layer 502 of a DMOSFET, a buried collector diffused layer 503 of an NPN bipolar transistor, a buried diffused layer 504 of a PNP bipolar transistor, and a buried diffused layer 505 of a PMOSFET. Then, boron ions are implanted at 40 keV and $8 \times 10^{13}/cm^2$ and a heat treatment is subsequently performed with respect to the semiconductor substrate 501 at a temperature of about 900° C. for about 30 minutes, thereby forming a buried body diffused layer 506 of the DMOSFET, a collector diffused layer 507 of the PNP bipolar transistor, a buried diffused layer 508 of the NMOSFET, and a buried isolation diffused layer 509 for isolation.

Next, as shown in FIG. 18(b), an N-type epitaxial layer 510 having a resistivity of about 1 Ω·cm and a thickness of 2.5 μm is formed. Then, boron ions are implanted at 150 keV and $2 \times 10^{12}/cm^2$ and a heat treatment is performed with respect to the semiconductor substrate 501 at a temperature of about 1100° C. for about 100 minutes to form a well diffused layer 511 for isolation, a collector diffused layer 512 of the PNP bipolar transistor, and a body diffused layer 513 of the NMOSFET.

There are at least partially overlapping portions between the well diffused layer 511 and the buried isolation diffused layer 509, between the buried diffused layer 508 and body diffused layer 513 of the NMOSFET, and between the buried collector diffused layer 507 and collector diffused layer 512 of the PNP bipolar transistor. Since the diffusion rate of boron is higher than that of arsenic, a part of the buried body diffused layer 506 extends to overlie the buried drain diffused layer 502 as a result of the heat treatment. On the other hand, the buried body diffused layer 506 is lower in impurity concentration than the buried drain diffused layer 502. As a result, the buried body diffused layer 506 is divided into upper and lower parts by the buried drain diffused layer 502.

Next, as shown in FIG. 18(c), a thermal oxide film 514 having a thickness of about 350 nm is formed on the N-type epitaxial layer 510 by selective oxidation or like method. Then, boron ions are implanted at 30 keV and $1.2 \times 10^{13}/cm^2$ to form an intrinsic base diffused layer 515 of the NPN bipolar transistor. Subsequently, phosphorus ions are implanted at 150 keV and $1.22 \times 10^{13}/cm^2$ to form an intrinsic base diffused layer 516 of the PNP bipolar transistor.

Next, as shown in FIG. 18(d), the substrate surface is covered with gate oxide films 517 having a thickness of about 15 nm, followed by the deposition of a polysilicon film having a thickness of about 0.4 μm thereon, which is then patterned to form an N-type gate electrode 518 of the DMOSFET, an N-type gate electrode 519 of the NMOSFET, and an N-type gate electrode 520 of the PMOSFET. Then, boron ions are implanted at 140 keV and $3 \times 10^{14}/cm^2$ to form a body diffused layer 521 of the DMOSFET. The body diffused layer 521 at least partially overlaps the buried body diffused layer 506. Subsequently, arsenic ions are implanted at 40 keV and $1 \times 10^{16}/cm^2$ to form a source diffused layer 522 and a drain contact diffused layer 523 of the DMOSFET, an emitter diffused layer 524 and a collector contact diffused layer 525 of the NPN bipolar transistor, and source/drain diffused layers 526 of the NMOSFET. In the DMOSFET, a region of the body diffused layer 521 underlying the N-type gate electrode 518 and interposed between the source diffused layer 522 and the N-type epitaxial layer 510 forms a channel region 527. The length of the channel region 527 is determined by a difference in lateral diffusion length between the body diffused layer 521 and the source diffused layer 522. Then, ions of boron fluoride are implanted at 40 keV and $3 \times 10^{15}/cm^2$ to form a body contact diffused layer 528 of the DMOSFET, an emitter diffused layer 529 and a collector contact diffused layer 530 of the PNP bipolar transistor, and source/drain diffused layers 531 of the PMOSFET.

Next, as shown in FIG. 18(e), a protective film 532 having a thickness of about 0.7 μm is formed, followed by the formation of metal electrodes 533 on the respective elements, thereby finishing the semiconductor device.

In the present embodiment, the body diffused layer 506 partially overlaps the body diffused layer 521 to form the body region in the DMOSFET isolated by the PN junction isolation. The impurity concentration of the channel region 527 near the substrate surface is predominantly determined by the impurity concentration of the body diffused layer 521. On the other hand, the impurity concentration of the body region inside the substrate becomes equal to the impurity concentration of the buried body diffused layer 506 or the sum of the impurity concentration of the buried body diffused layer 506 and the impurity concentration of the body diffused layer 506. Since the body diffused layer 521 is lower in impurity concentration than the buried body diffused layer 506, the base resistance of the parasitic bipolar transistor is reduced. Hence, the on-resistance of the DMOSFET can be reduced at the same time as the activation of the bipolar transistor is suppressed.

Moreover, in contrast to the conventional process of forming BiCMOS and DMOSFET, the present embodiment does not require an extra step added to the process of forming BiCMOS and DMOSFET since the buried body diffused layer 506 of the DMOSFET is formed simultaneously with the formation of the buried diffused layers 507 to 509 of the same conductivity type as the semiconductor substrate 501 in the BiCMOS process. Hence, the on-resistance of the DMOSFET can be reduced at the same time as the activation of the parasitic bipolar transistor is suppressed without affecting the properties of the bipolar transistor and MOSFET and without increasing the cost of manufacturing the semiconductor device.

In the present embodiment, the buried drain diffused layer 502 of the same conductivity type as the semiconductor substrate 501 has resistance lower than that of the semiconductor substrate 501, since the impurity concentration of the buried drain diffused layer 502 is higher than that of the semiconductor substrate 501. Accordingly, the drain current passing through the channel region 527 flows through the buried drain diffused layer 502 having lower resistance rather than the semiconductor substrate 501 having higher resistance, so that the resulting DMOSFET has lower on-resistance.

Furthermore, a Zener diode is formed between the buried body diffused layer 506 and the buried drain diffused layer 502 in the present embodiment. Since a high-voltage surge from a load or the like is absorbed by the Zener diode, a high-surge-withstand property is obtained.

Thirteenth Embodiment

As shown in FIG. 19(a), phosphorus ions are implanted at 180 keV and $2\times10^{13}/cm^2$ and boron ions are subsequently implanted at 150 keV and $2\times10^{12}/cm^2$ into a P-type semiconductor substrate 601 having a resistivity of 10 to 20 Ω·cm. Thereafter, a heat treatment is performed at about 1100° C. for about 100 minutes to form a drain diffused layer 602 of a DMOSFET, a collector diffused layer 603 of an NPN bipolar transistor, an isolation diffused layer 604 of a PNP bipolar transistor, a body diffused layer 605 of a PMOSFET, a collector diffused layer 606 of a PNP bipolar transistor, a body diffused layer 607 of an NMOSFET, and a well diffused layer 608 for isolation.

Next, as shown in FIG. 19(b), a heat oxide film 609 having a thickness of 350 nm is formed on the semiconductor substrate 601 by selective oxidation or like method. Then, boron ions are implanted at 30 keV and $1.2\times10^{13}/cm^2$ to form an intrinsic base diffused layer 610 of the NPN bipolar transistor. Subsequently, phosphorus ions are implanted at 150 keV and $1.22\times10^{13}/cm^2$ to form an intrinsic base diffused layer 611 of the PNP bipolar transistor.

Next, as shown in FIG. 19(c), the substrate surface is covered with gate oxide films 612 having a thickness of about 15 nm, followed by the deposition of a polysilicon film having a thickness of about 0.4 μm, which is then patterned to form an N-type gate electrode 613 of the DMOSFET, an N-type gate electrode 614 of the NMOSFET, and an N-type gate electrode 615 of the PMOSFET. Then, boron ions are implanted at 140 keV and $3\times10^{14}/cm^2$ to form a body diffused layer 616 of the DMOSFET. Subsequently, boron ions are implanted at 500 keV and $5\times10^{14}/cm^2$ to form a buried body diffused layer 617 of the DMOSFET. The body diffused layer 616 at least partially overlaps the buried body diffused layer 617. Thereafter, arsenic ions are implanted at 2500 keV and $5\times10^{13}/cm^2$ to form a buried drain diffused layer 618 of the DMOSFET.

Next, as shown in FIG. 19(d), arsenic ions are implanted again at 40 keV and $1\times10^{16}/cm^2$ to form a source diffused layer 619 and a drain contact layer 620 of the DMOSFET, an emitter diffused layer 621 and collector contact diffused layer 622 of the NPN bipolar transistor, and source/drain diffused layers of the NMOSFET. In the DMOSFET, a region of the body diffused layer 616 underlying the N-type gate electrode 613 and interposed between the source diffused layer 619 and the drain diffused layer 602 forms a channel region 624. The length of the channel region 624 is determined by a difference in lateral diffusion length between the body diffused layer 616 and the source diffused layer 619. Then, ions of boron fluoride are implanted at 40 keV and $3\times10^{15}/cm^2$ to form a body contact diffused layer 625 of the DMOSFET, an emitter diffused layer 626 and a collector contact diffused layer 627 of the PNP bipolar transistor, and source/drain diffused layers 628 of the PMOSFET.

Next, as shown in FIG. 19(e), a protective film 629 having a thickness of about 0.7 μm is formed, followed by the formation of metal electrodes 630 on respective elements, thereby finishing the semiconductor substrate.

In the present embodiment, the buried body diffused layer 617 partially overlaps the body diffused layer 616 to form a body region in the DMOSFET isolated by the PN junction isolation. The impurity concentration of the channel region 624 near the substrate surface is predominantly determined by the impurity concentration of the body diffused layer 616. On the other hand, the impurity concentration of the body region inside the substrate becomes equal to the impurity concentration of the buried body diffused layer 617 or the sum of the impurity concentration of the buried body diffused layer 617 and the impurity concentration of the body diffused layer 616. Since the body diffused layer 616 is lower in impurity concentration than the buried body diffused layer 617, the base resistance of the parasitic bipolar transistor is reduced. Hence, the on-resistance of the DMOSFET can be reduced at the same time as the activation of the parasitic bipolar transistor is suppressed.

In addition, the present embodiment does not require the formation of an epitaxial layer which has conventionally been required to reduce the on-resistance of the DMOSFET or to provide isolation in the case of forming the DMOSFET in the BiCMOS process. The epitaxial layer is unnecessary in the present embodiment since the on-resistance can be reduced by the buried body diffused layer 617 formed in the DMOSFET and the isolation has been formed. Consequently, the cost of manufacturing a semiconductor device is not increased, while the properties of the bipolar transistor and MOSFET are not affected.

In the present embodiment, the buried drain diffused layer 618 of the same conductivity type as the semiconductor substrate 601 has resistance lower than that of the semiconductor substrate 601, since the impurity concentration of the buried drain diffused layer 618 is higher than that of the semiconductor substrate 601. Accordingly, the drain current passing through the channel region 624 flows through the buried drain diffused layer 618 having lower resistance rather than the semiconductor substrate 601 having higher resistance, so that the resulting DMOSFET has lower on-resistance.

Furthermore, a Zener diode is formed between the buried body diffused layer 617 and the buried drain diffused layer 618 in the present embodiment. Since a high-voltage surge from a load or the like is absorbed by the Zener diode, a high-surge-withstand property is obtained.

Although the buried body diffused layer 617 and the buried drain diffused layer 618 are formed after the body diffused layer 616 is formed, it is not necessarily required to perform the two steps in the foregoing order. The two steps may be performed at any stage in an arbitrary order.

The types and conditions of the manufacturing process is not limited to those described in the eighth to thirteenth embodiments. It will be appreciated that such processes as thermal oxidation and CVD or ion implantation and thermal diffusion are interchangeable.

We claim:

1. A semiconductor device having at least one DMISFET formed in an active region of a semiconductor substrate surrounded by an isolation, wherein said DMISFET comprises:

a first impurity diffused layer formed by introducing an impurity of first conductivity type at a low concentration into said active region;

a gate insulating film formed on said active region;

a gate electrode formed on said gate insulating film;

a source diffused layer formed by introducing the impurity of first conductivity type at a high concentration into a portion of said active region located below one side of said gate electrode;

a drain diffused layer formed by introducing the impurity of first conductivity type at a high concentration into a portion of said active region located below the opposite side of said gate electrode to be surrounded by said first impurity diffused layer; and a second impurity diffused layer formed by introducing the impurity of second conductivity type into a portion surrounding said source diffused layer and reaching a part of an area underlying said gate electrode in said active region, said second impurity diffused layer being separated from said drain diffused layer by said first impurity diffused layer, said second impurity diffused layer having a profile such that a depth of penetration in said semiconductor substrate is larger at both edge portions than at a central portion in an area of said active region underlying the source diffused layer.

2. A semiconductor device according to claim 1, wherein said DMISFET further comprises:

a third impurity diffused layer formed by introducing an impurity of second conductivity type at a high concentration into an area of said active region including a deep portion of said second impurity diffused layer and not including a vicinity of a surface thereof.

3. A semiconductor device according to claim 1, further comprising a protective film formed on said gate electrode and having a function of inhibiting the penetration of impurity ions.

4. A semiconductor device according to claim 1, further comprising a first MISFET having a first-conductivity-type channel structure formed in a second active region of said semiconductor substrate surrounded by said isolation and a second MISFET having a second-conductivity-type channel structure formed in a third active region of said semiconductor substrate surrounded by said isolation, wherein said first MISFET comprises:
a gate insulating film formed on said second active region;
a gate electrode formed on said gate insulating film; and
source/drain diffused layers formed by introducing the impurity of first conductivity type into respective areas located on both sides of said gate electrode in said second active region and said second MISFET comprises:
a gate insulating film formed on said third active region;
a gate electrode formed on said gate insulating film; and
source/drain diffused layers formed by introducing an impurity of second conductivity type into respective areas located on both sides of said gate electrode in said third active region.

5. A semiconductor device according to claim 4, wherein the gate insulating films of said first and second MISFETs are composed of the same material as that composing the gate insulating film of said DMISFET and have the same thickness as that of the gate insulating film of said DMISFET and the gate electrodes of said first and second MISFETs are composed of the same material as that composing the gate electrode of said DMISFET and have the same thickness as that of the gate electrode of said DMISFET.

6. A semiconductor device according to claim 1, further comprising a side wall spacer formed on each side of said gate electrode.

7. A semiconductor device having at least one DMISFET formed in an active region of a semiconductor substrate surrounded by an isolation, wherein said DMISFET comprises:

a first impurity diffused layer formed by introducing an impurity of first conductivity type at a low concentration into said active region;

a gate insulating film formed on said active region;

a gate electrode formed on said gate insulating film;

a source diffused layer formed by introducing the impurity of first conductivity type at a high concentration into a portion of said active region located below one side of said gate electrode;

a drain diffused layer formed by introducing the impurity of first conductivity type at a high concentration into a portion of said active region located below the opposite side of said gate electrode to be surrounded by said first impurity diffused layer; and a second impurity diffused layer formed by introducing an impurity of second conductivity type into a portion surrounding said source diffused layer and reaching a part of an area underlying said gate electrode in said active region, said second impurity diffused layer being separated from said drain diffused layer by said first impurity diffused layer, said second impurity diffused layer having a profile such that a depth of penetration in said semiconductor substrate is larger at a portion closer to said gate electrode than at a portion closer to said isolation in an area of said active region underlying the source diffused layer.

8. A semiconductor device having at least one MISFET for high voltage formed in an active region of a semiconductor substrate surrounded by an isolation, wherein said MISFET for high voltage comprises:

a gate insulating film formed on said active region;

a gate electrode formed on a gate insulating film;

a first impurity diffused layer formed by introducing an impurity of first conductivity type at a low concentration into a portion of said active region including an area underlying one edge of said gate electrode and an area extending laterally therefrom, said first impurity diffused layer functioning as a drain;

a source diffused layer formed by introducing the impurity of first conductivity type at a high concentration into a portion of said active region laterally extending from the other edge of said gate electrode;

a second impurity diffused layer formed by introducing an impurity of second conductivity type into an area of said active region surrounding said source diffused layer and including a portion forming a channel region underneath said gate electrode and between said source diffused layer and said first impurity diffused layer such that an impurity concentration becomes higher in a deeper portion of the second impurity diffused layer; and a buried drain diffused layer formed by introducing the impurity of first conductivity type into a portion of said second impurity diffused layer located at a depth in said semiconductor substrate, said buried drain diffused layer dividing said second impurity diffused layer into upper and lower parts.

9. A semiconductor device according to claim 8, further comprising a second bipolar transistor having an emitter diffused layer of first conductivity type, a base diffused layer of second conductivity type, a collector diffused layer of first conductivity type, and a buried collector diffused layer formed by introducing the impurity of first conductivity type into a portion of said collector diffused layer located at the depths of said semiconductor substrate, said second bipolar transistor lying in a fourth active region of said semiconductor substrate, wherein said buried collector diffused layer has the same depth and the same impurity concentration as said buried drain diffused layer of said MISFET for high voltage.

10. A semiconductor device according to claim 8, further comprising a second MISFET having source/drain diffused layers of second conductivity type, a body diffused layer of first conductivity type, and a buried layer of first conductivity type formed below the body diffused layer, each lying in a fifth active region of said semiconductor substrate, wherein said buried layer of said second MISFET has the same depth and the same impurity concentration as said buried drain diffused layer of said MISFET for high voltage.

11. A semiconductor device having at least one MISFET for high voltage formed in an active region of a semiconductor substrate surrounded by an isolation, wherein said MISFET for high voltage comprises:

a gate insulating film formed on said active region;

a gate electrode formed on a gate insulating film;

a first impurity diffused layer formed by introducing an impurity of first conductivity type at a low concentration into a portion of said active region including an area underlying one edge of said gate electrode and an area extending laterally therefrom, said first impurity diffused layer functioning as a drain;

a source diffused layer formed by introducing the impurity of first conductivity type at a high concentration into a portion of said active region laterally extending from the other edge of said gate electrode;

a second impurity diffused layer formed by introducing an impurity of second conductivity type into an area of said active region surrounding said source diffused layer and including a portion forming a channel region underneath said gate electrode and between said source diffused layer and said first impurity diffused layer such that an impurity concentration becomes higher in a deeper portion of the second impurity diffused layer; and a first bipolar transistor having an emitter diffused layer of second conductivity type, a base diffused layer of first conductivity type, and a collector diffused layer of second conductivity type, said first bipolar transistor lying in a second active region of said semiconductor substrate, wherein said collector diffused layer is formed by introducing the impurity of second conductivity type into said semiconductor substrate such that an impurity concentration becomes higher in a deeper portion of the semiconductor substrate, said collector diffused layer having the same depth as the second impurity diffused layer of said MISFET for high voltage.

12. A semiconductor device having at least one MISFET for high voltage formed in an active region of a semiconductor substrate surrounded by an isolation, wherein said MISFET for high voltage comprises:

a gate insulating film formed on said active region;

a gate electrode formed on a gate insulating film;

a first impurity diffused layer formed by introducing an impurity of first conductivity type at a low concentration into a portion of said active region including an area underlying one edge of said gate electrode and an area extending laterally therefrom, said first impurity diffused layer functioning as a drain;

a source diffused layer formed by introducing the impurity of first conductivity type at a high concentration into a portion of said active region laterally extending from the other edge of said gate electrode;

a second impurity diffused layer formed by introducing an impurity of second conductivity type into an area of said active region surrounding said source diffused layer and including a portion forming a channel region underneath said gate electrode and between said source diffused layer and said first impurity diffused layer such that an impurity concentration becomes higher in a deeper portion of the second impurity diffused layer, said second impurity diffused layer comprising a buried body diffused layer formed by introducing the impurity of second conductivity type at a higher concentration into a deep portion of said semiconductor substrate and a body diffused layer formed by introducing the impurity of second conductivity type at a lower concentration into a portion shallower than said buried body diffused layer of said semiconductor substrate, said buried body diffused layer and said body diffused layer overlapping each other; and a first bipolar transistor having an emitter diffused layer of second conductivity type, a base diffused layer of first conductivity type, a collector diffused layer of second conductivity type, and a buried collector layer formed by introducing the impurity of second conductivity type at a higher concentration than said collector diffused layer into a portion underlying said collector diffused layer, said first bipolar transistor lying in a second active region of said semiconductor substrate, wherein said buried collector diffused layer has the same impurity concentration and the same depth as the buried body diffused layer of said MISFET for high voltage.

13. A semiconductor device having at least one MISFET for high voltage formed in an active region of a semiconductor substrate surrounded by an isolation, wherein said MISFET for high voltage comprises:

a gate insulating film formed on said active region;

a gate electrode formed on a gate insulating film;

a first impurity diffused layer formed by introducing an impurity of first conductivity type at a low concentration into a portion of said active region including an area underlying one edge of said gate electrode and an area extending laterally therefrom, said first impurity diffused layer functioning as a drain;

a source diffused layer formed by introducing the impurity of first conductivity type at a high concentration into a portion of said active region laterally extending from the other edge of said gate electrode;

a second impurity diffused layer formed by introducing an impurity of second conductivity type into an area of said active region surrounding said source diffused layer and including a portion forming a channel region underneath said gate electrode and between said source diffused layer and said first impurity diffused layer such that an impurity concentration becomes higher in a deeper portion of the second impurity diffused layer, said second impurity diffused layer comprising a buried body diffused layer formed by introducing the impurity of second conductivity type at a higher concentration into a deep portion of said semiconductor substrate and a body diffused layer formed by introducing the impurity of second conductivity type at a lower concentration into a portion shallower than said buried body diffused layer of said semiconductor substrate, said buried body diffused layer and said body diffused layer overlapping each other; and a first MISFET having source/drain diffused layers of first conductivity type, a body diffused layer of second conductivity type, and a buried layer of second conductivity type formed below said body diffused layer, said first MISFET lying in a third active region of said semiconductor substrate, wherein the buried layer of said first MISFET has the same depth and the same impurity concentration as said buried body diffused layer of said MISFET for high voltage.

* * * * *